US010872821B1

(12) United States Patent
 Wu

(10) Patent No.: US 10,872,821 B1
(45) Date of Patent: Dec. 22, 2020

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventor: Tung-Jiun Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/450,346

(22) Filed: Jun. 24, 2019

(51) Int. Cl.
  *H01L 21/336* (2006.01)
  *H01L 21/8234* (2006.01)
  *H01L 29/66* (2006.01)
  *H01L 21/768* (2006.01)
  *H01L 27/088* (2006.01)
  *H01L 29/78* (2006.01)

(52) U.S. Cl.
  CPC .............. *H01L 21/823431* (2013.01); *H01L 21/76829* (2013.01); *H01L 21/823475* (2013.01); *H01L 27/0886* (2013.01); *H01L 29/66795* (2013.01); *H01L 29/785* (2013.01)

(58) Field of Classification Search
  CPC ......... H01L 21/823431; H01L 27/0886; H01L 29/66795; H01L 29/785; H01L 21/76829; H01L 21/823475
  See application file for complete search history.

(56) References Cited

U.S. PATENT DOCUMENTS

| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |

*Primary Examiner* — Robert G Bachner
(74) *Attorney, Agent, or Firm* — Wpat, P.C., Intellectual Property Attorneys; Anthony King

(57) ABSTRACT

A method for manufacturing a semiconductor structure is provided. The method includes: providing a substrate; forming a plurality of fin structures on the substrate; disposing a first dielectric layer over and between the plurality of fin structures; disposing a second dielectric layer over the first dielectric layer; removing a portion of the first dielectric layer and a portion of the second dielectric layer, wherein each of the plurality of fin structures is at least partially exposed through the first dielectric layer and the second dielectric layer; forming a gate structure over the plurality of fin structures; forming an interlayer dielectric (ILD) layer over the first dielectric layer and the second dielectric layer and around the gate structure; removing a portion of the ILD layer; and forming a contact extending into the ILD layer, wherein the contact is disposed above the second dielectric layer. A semiconductor structure thereof is also provided.

20 Claims, 31 Drawing Sheets

SEMICONDUCTOR STRUCTURE AND MANUFACTURING METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling-down process provides broad benefits by increasing production efficiency and lowering associated costs while increasing the amount of functionality that can be provided in the reduced chip area. Such scaling down has also increased complexities of processing and manufacturing ICs, and quality control of the products has become more stringent.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
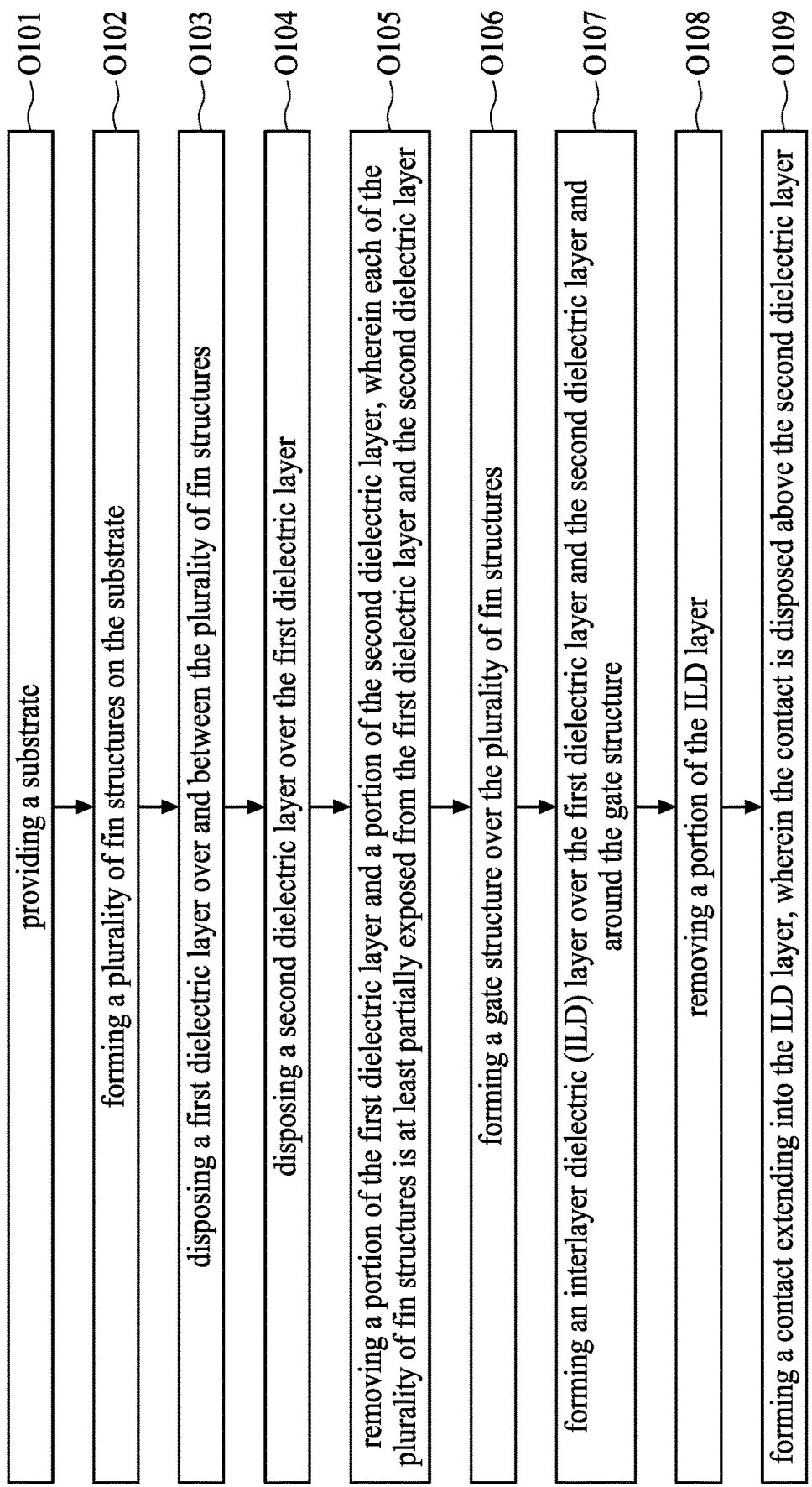
FIG. 1 is a flowchart showing various steps of a method for manufacturing a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

An interconnect structure is formed over a transistor of a semiconductor in order to electrically connect the transistor and external electronic device. In order to provide electrical connection between the transistor and the interconnect structure, one or more contacts are formed in dielectric layers to electrically interconnect, for instance, a source/drain of the transistor and the interconnect structure. As a scale of the transistor is significantly smaller than a scale of an external electronic device, a larger recess for forming the contact can provide a larger process window in formation of the electrical connection between the source/drain and the interconnect structure. A contact is sometimes formed over a region between the transistors in order to provide larger process window. However, an issue of dishing may occur in the region between the transistors, and the contact subsequently formed may electrically connect to the silicon substrate resulting in short circuit. In the present disclosure, a method is provided to prevent the issue of short circuits and can be easily integrated with a conventional manufacturing method of a semiconductor device. A semiconductor structure thereof is also provided.

FIG. 1 is a flowchart showing a method M10 for manufacturing a semiconductor structure in accordance with some embodiments of the present disclosure. The method M10 includes several operations: (O101) providing a substrate; (O102) forming a plurality of fin structures on the substrate; (O103) disposing a first dielectric layer over and between the plurality of fin structures; (O104) disposing a second dielectric layer over the first dielectric layer; (O105) removing a portion of the first dielectric layer and a portion of the second dielectric layer, wherein each of the plurality of fin structures is at least partially exposed from the first dielectric layer and the second dielectric layer; (O106) forming a gate structure over the plurality of fin structures; (O107) forming an interlayer dielectric (ILD) layer over the first dielectric layer and the second dielectric layer and around the gate structure; (O108) removing a portion of the ILD layer; and (O109) forming a contact extending into the ILD layer, wherein the contact is disposed above the second dielectric layer.

Figure 2:
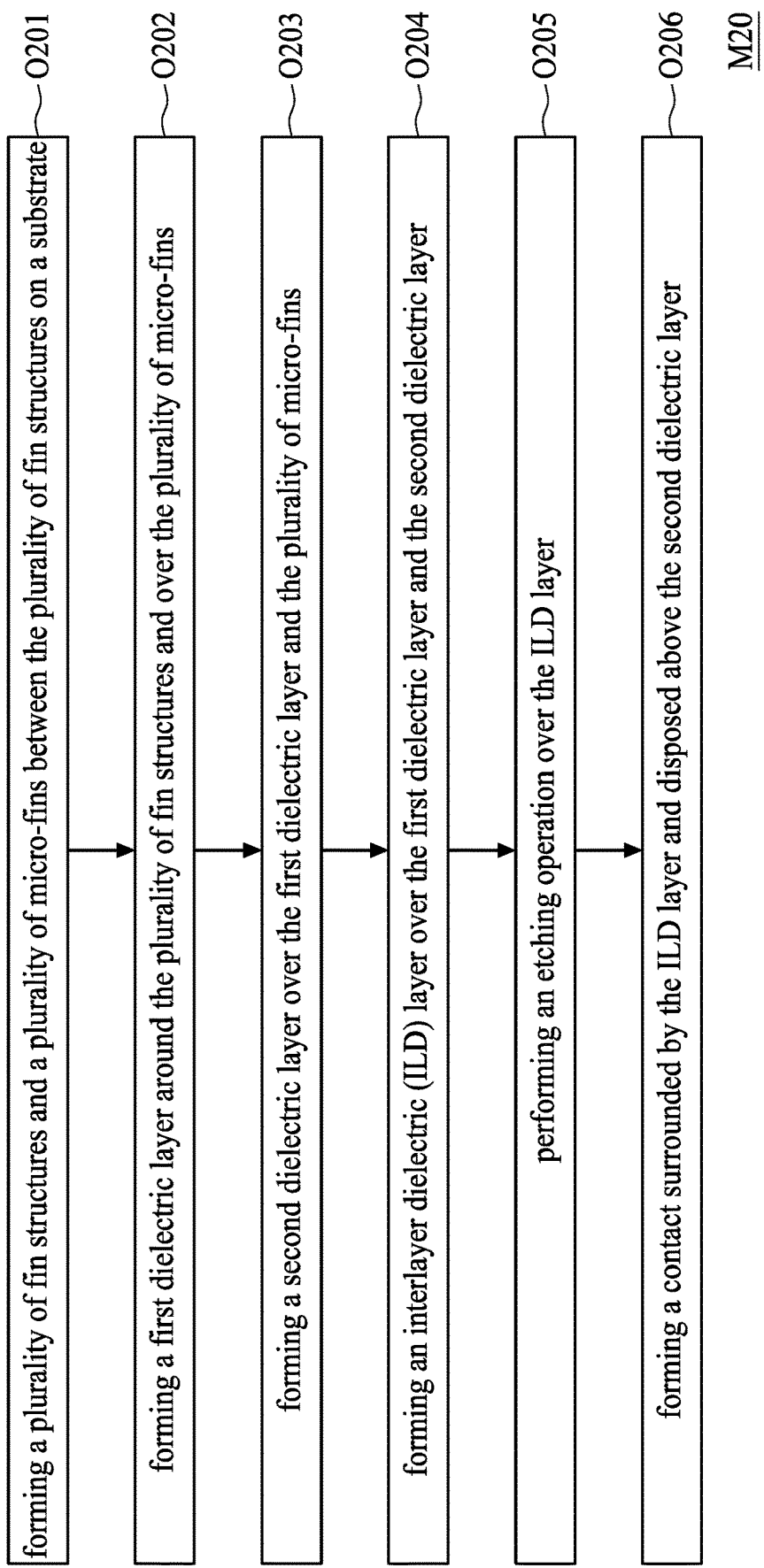
FIG. 2 is a flowchart showing various steps of a method for manufacturing a semiconductor structure in accordance with some embodiments of the present disclosure.

FIG. 2 is a flowchart showing a method M20 for manufacturing a semiconductor structure in accordance with some embodiments of the present disclosure. The method M20 includes several operations: (O201) forming a plurality of fin structures and a plurality of micro-fins between the plurality of fin structures on a substrate; (O202) forming a first dielectric layer around the plurality of fin structures and over the plurality of micro-fins; (O203) forming a second dielectric layer over the first dielectric layer and the plurality of micro-fins; (O204) forming an interlayer dielectric (ILD) layer over the first dielectric layer and the second dielectric layer; (O205) performing an etching operation over the ILD layer; and (O206) forming a contact surrounded by the ILD layer and disposed above the second dielectric layer.

In order to illustrate concepts and the methods M10 and M20 of the present disclosure, various embodiments are provided below. However, it is not intended to limit the present disclosure to specific embodiments. In addition, elements, conditions or parameters illustrated in different embodiments can be combined or modified to form different combinations of embodiments as long as the elements, parameters or conditions used are not conflicted. For ease of illustration, reference numerals with similar or same functions and properties are repeatedly used in different embodiments and figures.

Figure 3:
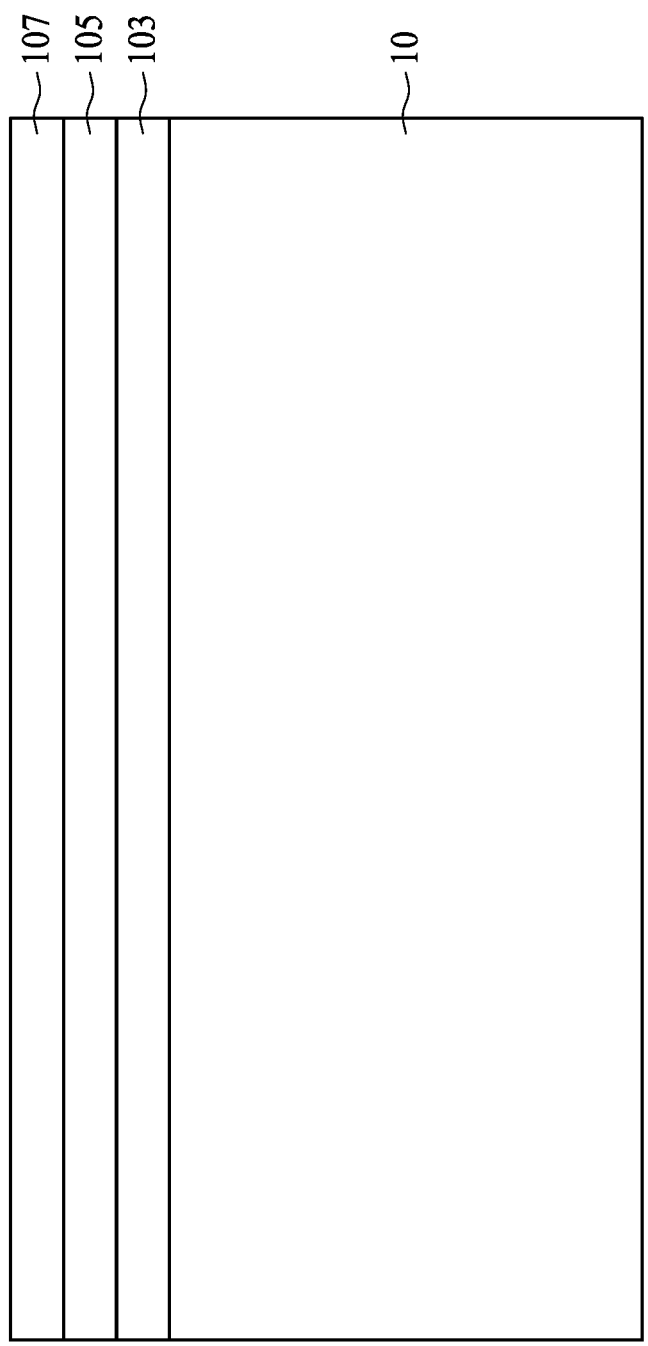
FIGS. 3 to 10 are cross-sectional diagrams of various steps of a method for manufacturing a semiconductor structure in accordance with some embodiments of the present disclosure.

FIGS. 3 to 10 are cross-sectional diagrams illustrating the operations O101 to O105 of the method M10 or the operations O201 to O203 of the method M20 in accordance with some embodiments of the present disclosure. A substrate 10 is provided or received as shown in FIG. 3. In some embodiments, a first barrier layer 103, a second barrier layer 105 and a hard mask layer 107 are formed sequentially over the substrate 10. In some embodiments, the first barrier layer 103, the second barrier layer 105 and the hard mask layer 107 are dielectric. In some embodiments, the first barrier layer 103 and the second barrier layer 105 include same or different dielectric materials. In some embodiments, the hard mask layer 107 includes nitride. In some embodiments, the hard mask layer 107 includes a dielectric material different from that of the second barrier layer 105. In some embodiments, the hard mask layer 107 has an etching rate different from an etching rate of the second barrier layer 105 with respect to an etchant.

Figure 4:
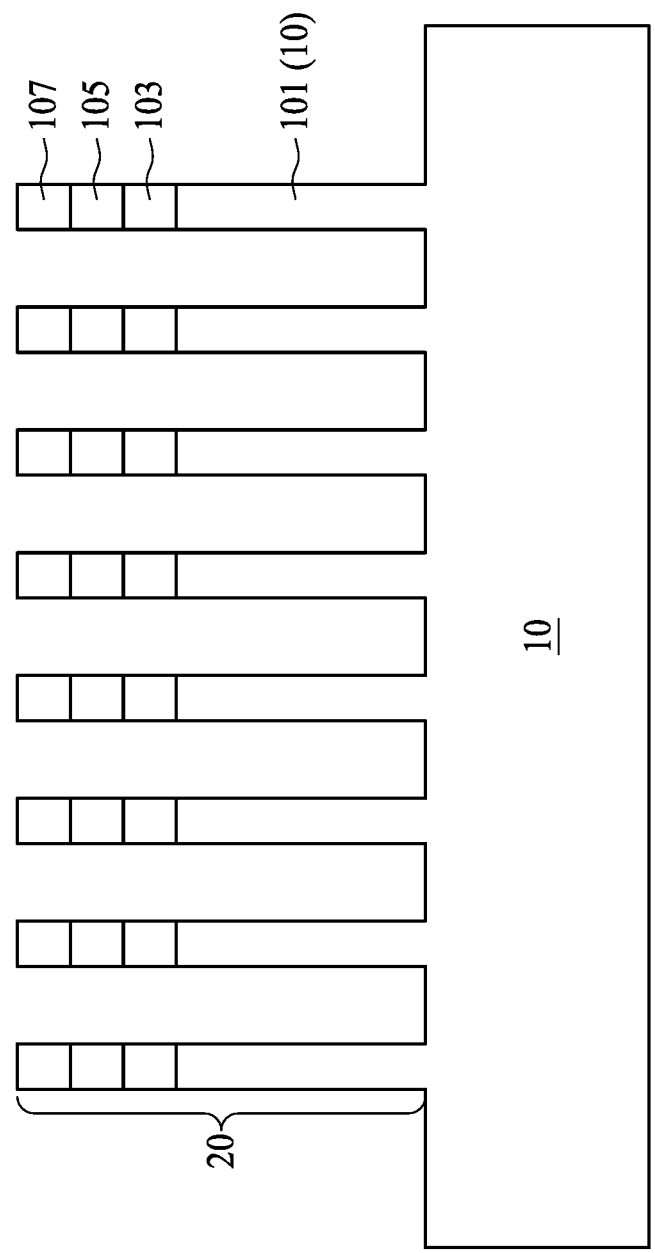

Referring to FIG. 4, a plurality of first fin structures 20 are formed on the substrate 10. In some embodiments, each of the first fin structures 20 includes a fin portion 101 of the substrate 10, a portion of the first barrier layer 103 on top of the fin portion 101, a portion of the second barrier layer 105 on top of the portion of the first barrier layer 103, and a portion of the hard mask layer 107 on top of the portion of the second barrier layer 105. In some embodiments, the first fin structures 20 are formed by one or multiple spacer patterning operations. In some embodiments, the first fin structures 20 is referred to as uncut fin structures representing to the fin structures prior to a fin cut operation.

Figure 5:
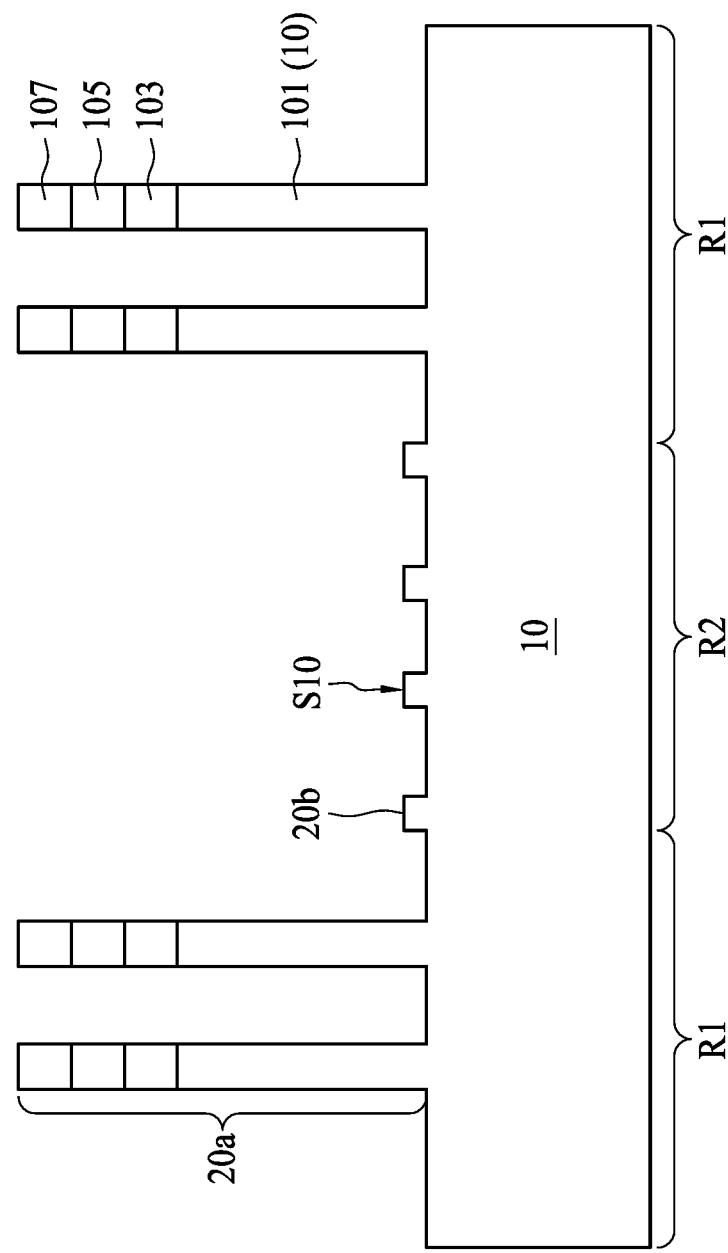

Referring to FIG. 5, a fin cut operation is performed to remove portions of the first fin structures 20, and the remaining first fin structures 20 are referred to as a plurality of second fin structures 20a for a purpose of ease of illustration. In some embodiments, the first fin structures 20 in one or more active regions R1 are left in place (referred as the second fin structures 20a), and the first fin structures 20 in one or more peripheral regions (or non-active regions) R2 are removed. In some embodiments, an isolation structure is to be formed in the peripheral region R2 in order to electrically separate different active regions R1. In some embodiments, the peripheral region R2 is adjacent to the active region R1. In some embodiments, the peripheral region R2 is between the active regions R1. In some embodiments, the active region R2 is surrounded by the peripheral region R2. In some embodiments, the peripheral region R2 is larger than the active region R1. FIG. 5 shows only a portion of the substrate 10 and two of the second fin structures 20a in two adjacent active regions R1 for the purpose of illustration, but is not intended to limit the disclosure, as other configurations are within the scope of the disclosure.

In some embodiments, a plurality of fin residues 20b (which may be referred to as micro-fins 20b if no additional removal of the substrate 10 is subsequently performed) are formed by the fin cut operation due to incomplete removal of the portions of the first fin structures 20. In some embodiments, the fin residues 20b are portions of the fin portions 101 of the substrate 10. In some embodiments, the fin residues 20b are formed in the peripheral region R2. In some embodiments, the fin residues 20b are protruded from the substrate 10. In some embodiments, the fin residues 20b represent uneven portions of a top surface S10 of the substrate 10 between the second fin structures 20a, and are formed by the fin cut operation. In some embodiments, at least a portion of the top surface S10 includes a rough surface. The fin residues 20b shown in FIG. 5 are for a purpose of illustration but are not intended to limit the present disclosure. In some embodiments, some of the first fin structures 20 are completely removed without leaving fin residues 20b behind. In some embodiments, the fin residues 20b are absent. In some embodiments, some of the first fin structures 20 are removed, and a recessed portion of the top surface S10 is formed at where the first fin structures 20 are removed from the substrate 10.

Figure 6:
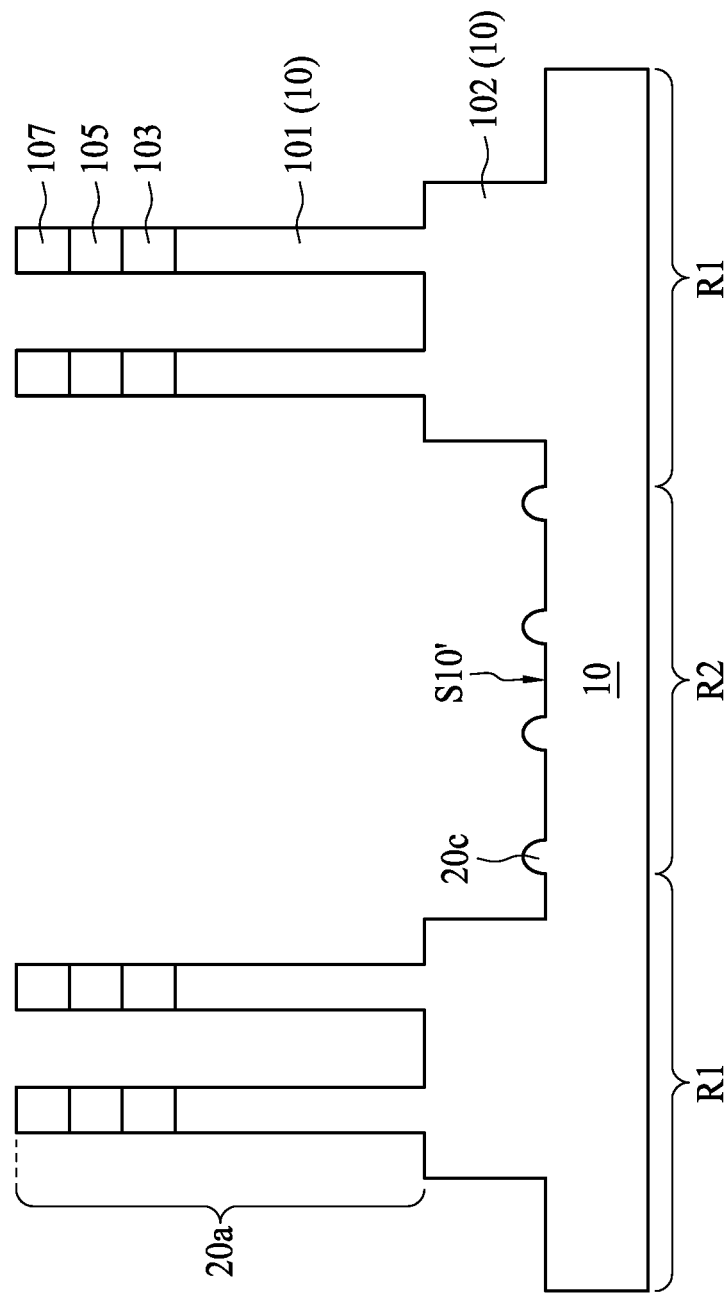

Referring to FIG. 6, portions of the substrate 10 around or between the second fin structures 20a are optionally removed to form one or more crown structures 102 at bottoms of the second fin structures 20a. In some embodiments, an etching operation is performed to remove the portions of the substrate 10 around or between the second fin structures 20a. In some embodiments, the etching operation is performed in the peripheral region R2 on the top surface S10 of the substrate 10, and as a result micro-fins 20c are formed from the fin residues 20b. In some embodiments, the plurality of micro-fins 20c are formed between the crown structures 102. In some embodiments, a profile of the micro-fins 20c corresponds to a profile of the fin residues 20b. In some embodiments, the micro-fins 20c represent uneven portions of a top surface S10' of the substrate 10 resulting from the etching operation. In some embodiments, the micro-fin 20c has a rounded surface compared with the fin residues 20b resulting from the previous etching operation performed in the peripheral region R2.

Figure 7:
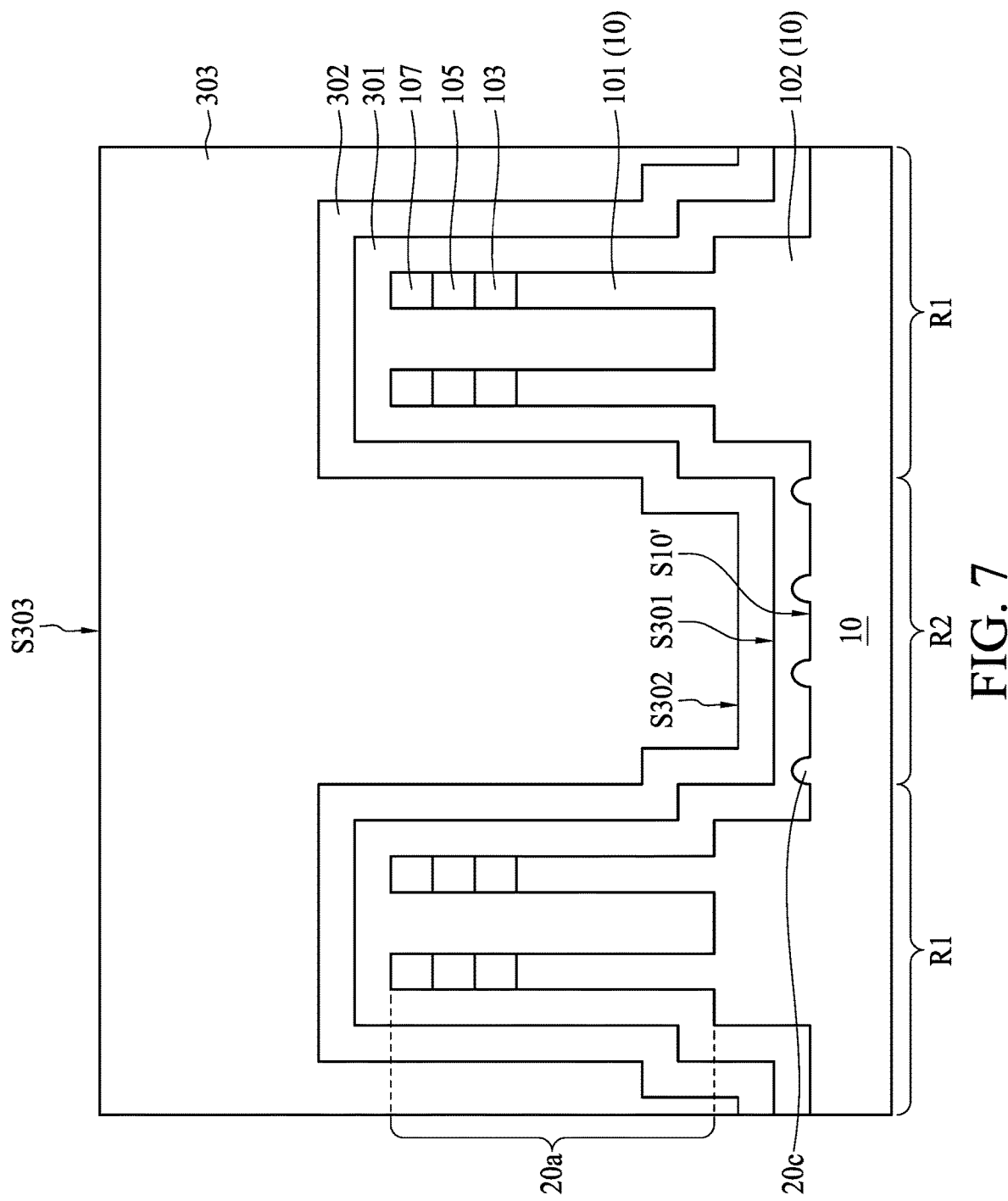

Referring to FIG. 7, a first dielectric layer 301 is formed over the substrate 10 and around the second fin structures 20a. In some embodiments, the first dielectric layer 301 is formed over the second fin structures 20a and the micro-fins 20c. In some embodiments, a conformal deposition is performed to form the first dielectric layer 301. In some embodiments, the first dielectric layer 301 fills space between the second fin structures 20a and over the crown structures 102. In some embodiments, a thickness of the first dielectric layer 301 is in a range of 10 to 30 nm. In some embodiments, the first dielectric layer 301 covers the micro-fins 20c. In some embodiments, a top surface S301 of the first dielectric layer 301 is above the top surface S10' of the substrate 10. In some embodiments, the top surface S301 of the first dielectric layer 301 between the crown structures 102 is an uneven or rough surface (not shown) due to the underlying uneven surface S10' of the substrate 10. In some embodiments, the top surface S301 of the first dielectric layer 301 is substantially planar. In some embodiments, the first dielectric layer 301 includes oxide.

A second dielectric layer 302 is formed over the first dielectric layer 301, the second fin structures 20a and the micro-fins 20c. In some embodiments, the second dielectric layer 302 is formed above the micro-fins 20c and the second fin structures 20a. In some embodiments, a conformal deposition is performed to form the second dielectric layer 302 as shown in FIG. 7. In some embodiments, a thickness of the second dielectric layer 302 is in a range of 20 to 40 nm. In some embodiments, the second dielectric layer 302 is formed over the second fin structures 20a and the crown structures 102, without filling space between the second fin structures 20a. In some embodiments, a top surface S302 of the second dielectric layer 302 is above the top surface S10' of the substrate 10 and the top surface of S301 of the first dielectric layer 301. In some embodiments, a profile of the second dielectric layer 302 is conformal to a profile of the top surface S301 of the first dielectric layer 301. In some embodiments, the top surface S302 of the second dielectric layer 302 between the crown structures 102 is an uneven or rough surface (not shown) due to the underlying uneven surface S301. In some embodiments, the uneven surface S302 is smoother than the uneven surface S301 due to multiple repetitions of deposition operations over the uneven surface S10'. In some embodiments, the top surface S302 of the second dielectric layer 302 is substantially planar. In some embodiments, the second dielectric layer 302 has an etching rate different from an etching rate of the first dielectric layer 301 with respect to an etchant. In some embodiments, the second dielectric layer 302 includes nitride.

In some embodiments, the second dielectric layer 302 is separated from the micro-fins 20c by the first dielectric layer 301. In some embodiments, one or more micro-fins 20c penetrate into the first dielectric layer 301. In some embodiments, one or more micro-fins 20c penetrate through the first dielectric layer 301 and in contact with the second dielectric layer 302 without penetrating through the second dielectric layer 302.

A third dielectric layer 303 is optionally formed over the second dielectric layer 302 as shown in FIG. 7. In some embodiments, the third dielectric layer 303 is disposed over the second dielectric layer 302, the second fin structures 20a and the micro-fins 20c. In some embodiments, a blanket deposition is performed to form the third dielectric layer 303. In some embodiments, a top surface S303 of the third dielectric layer 303 is substantially planar. In some embodiments, a thickness of the third dielectric layer 303 is in a range of 100 to 150 nm. In some embodiments, an etching rate of the third dielectric layer 303 is different from the etching rate of the second dielectric layer 302 with respect to the etchant. In some embodiments, the second dielectric layer 302 works as an etch stop layer or a protection layer to protect underlying layers and elements. In some embodiments, the micro-fins 20c are separated from the third dielectric layer 303 by the second dielectric layer 302. In some embodiments, the etching rate of the third dielectric layer 303 is similar to or substantially same as the etching rate of the first dielectric layer 301 with respect to the etchant. In some embodiments, the third dielectric layer 303 includes oxide.

Figure 8:
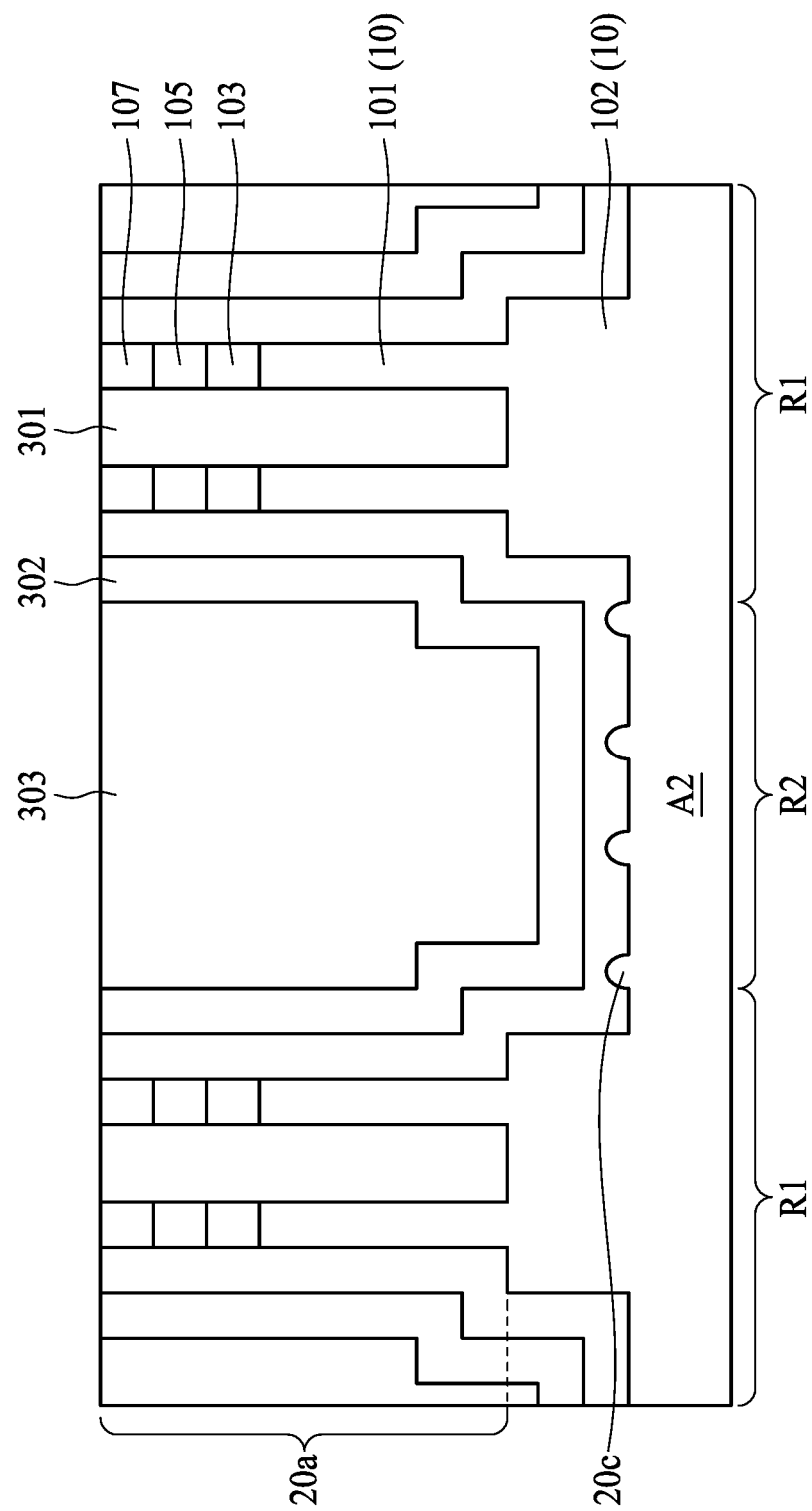
Figure 9:
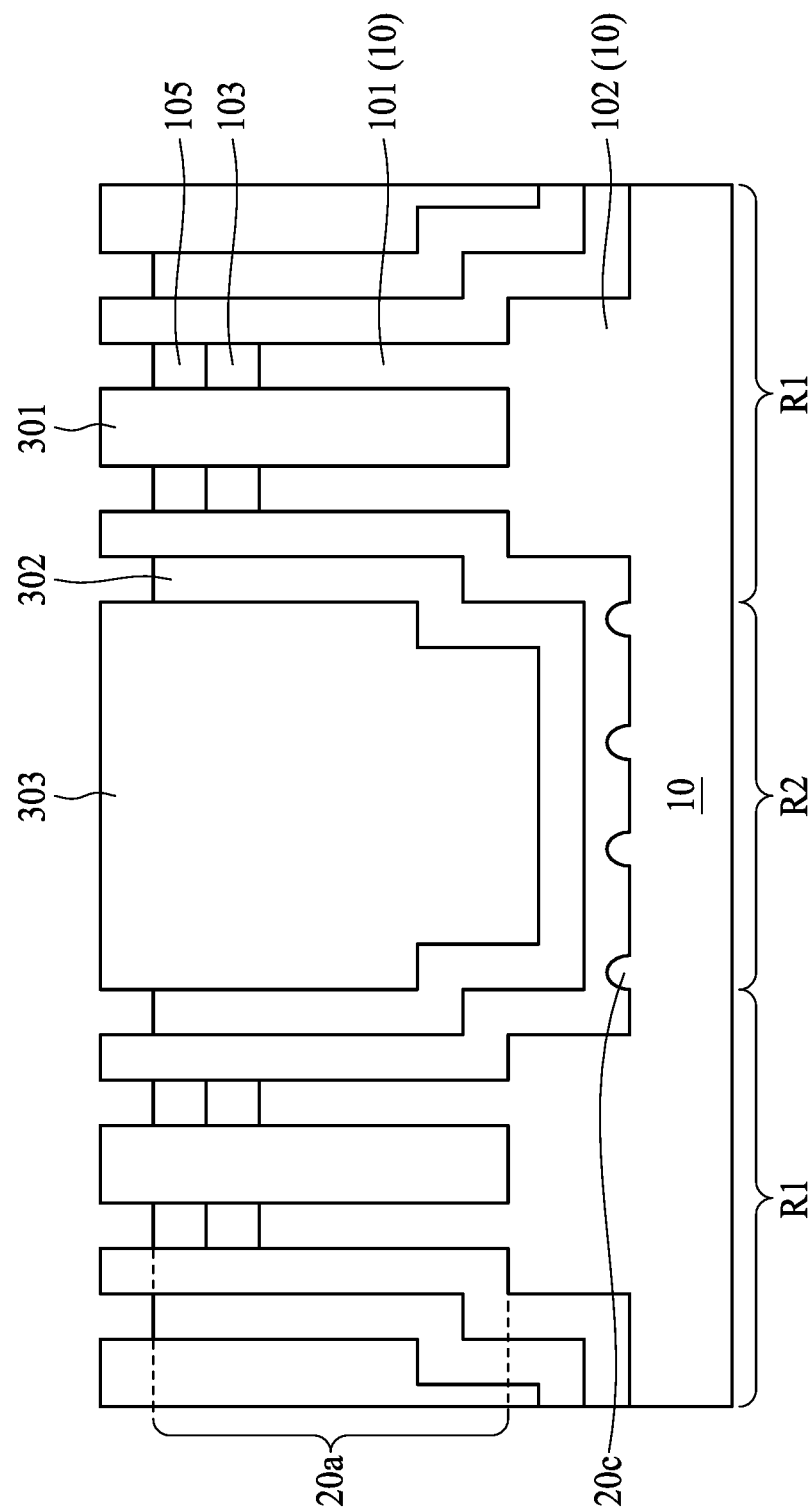

Referring to FIG. 8, a planarization is optionally performed until the hard mask layer 107 is exposed. In some embodiments, a portion of the first dielectric layer 301 and a portion of the second dielectric layer 302 are also exposed. In some embodiments, the planarization includes a chemical mechanical polishing (CMP) operation. Referring to FIG. 9, the hard mask layer 107 is removed, and as a result, the second fin structure 20a includes the fin portion 101, the first barrier layer 103 and the second barrier layer 105. In some embodiments, an etching operation utilizing the etchant is performed to remove the hard mask layer 107. In some embodiments, an etching rate of the hard mask layer 107 is similar to or substantially equal to the etching rate of the third dielectric layer 303 with respect to the etchant. In some embodiments, portions of the second dielectric layer 302 exposed through the third dielectric layer 303 are removed by the etching operation. In some embodiments, the hard mask layer 107 and the second dielectric layer 302 include nitride.

Figure 10:
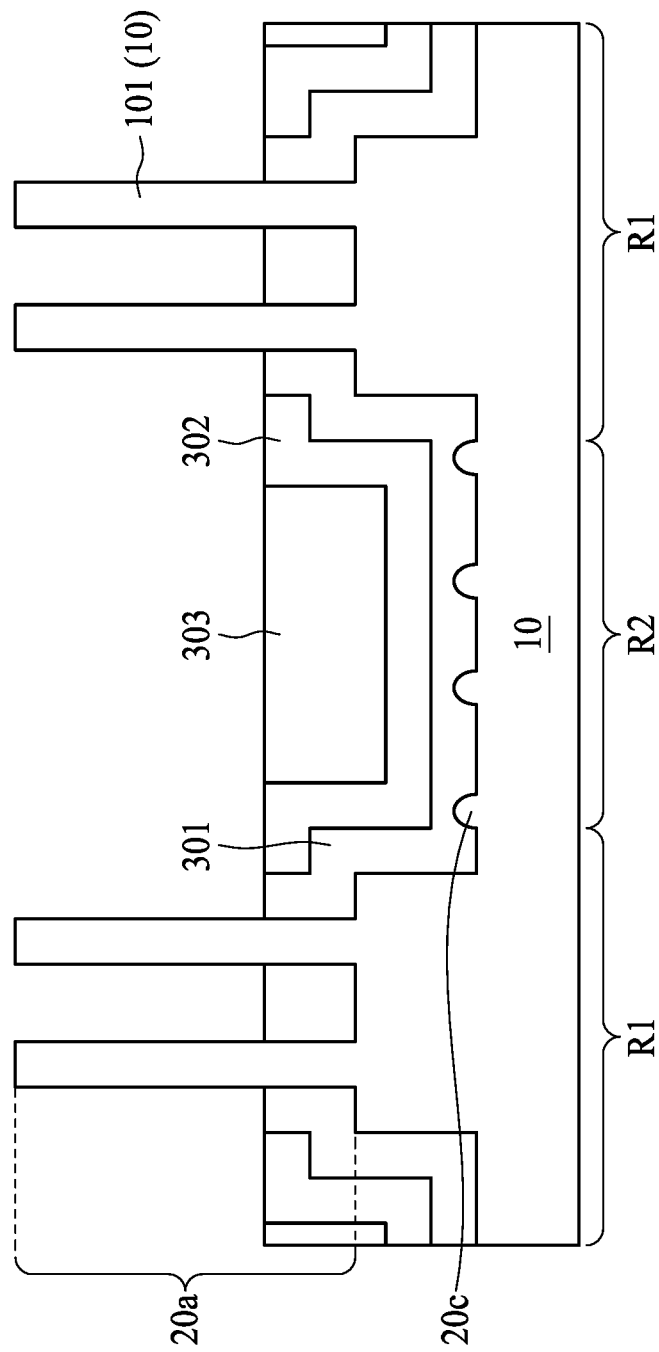

Referring to FIG. 10, the first barrier layer 103, the second barrier layer 105, a portion of the first dielectric layer 301, a portion of the second dielectric layer 302, and a portion of the third dielectric layer 303 are removed to expose portions of each of the fin portions 101 of the second fin structures 20a. In some embodiments, one or more etching operations are performed to at least partially expose each of the fin portions 101 of the second fin structures 20a. In some embodiments, the second fin structures 20a include only the fin portions 101. For ease of illustration, the second fin structures 20a are hereinafter referred to simply as the fin structures 20a after the exposure of the fin portions 101. In some embodiments, the first dielectric layer 301, the second dielectric layer 302 and the third dielectric layer 303 in the peripheral region R2 between the active regions R1 are collectively referred to as an isolation structure. In some embodiments, the isolation structure covers the micro-fins 20c.

Figure 11:
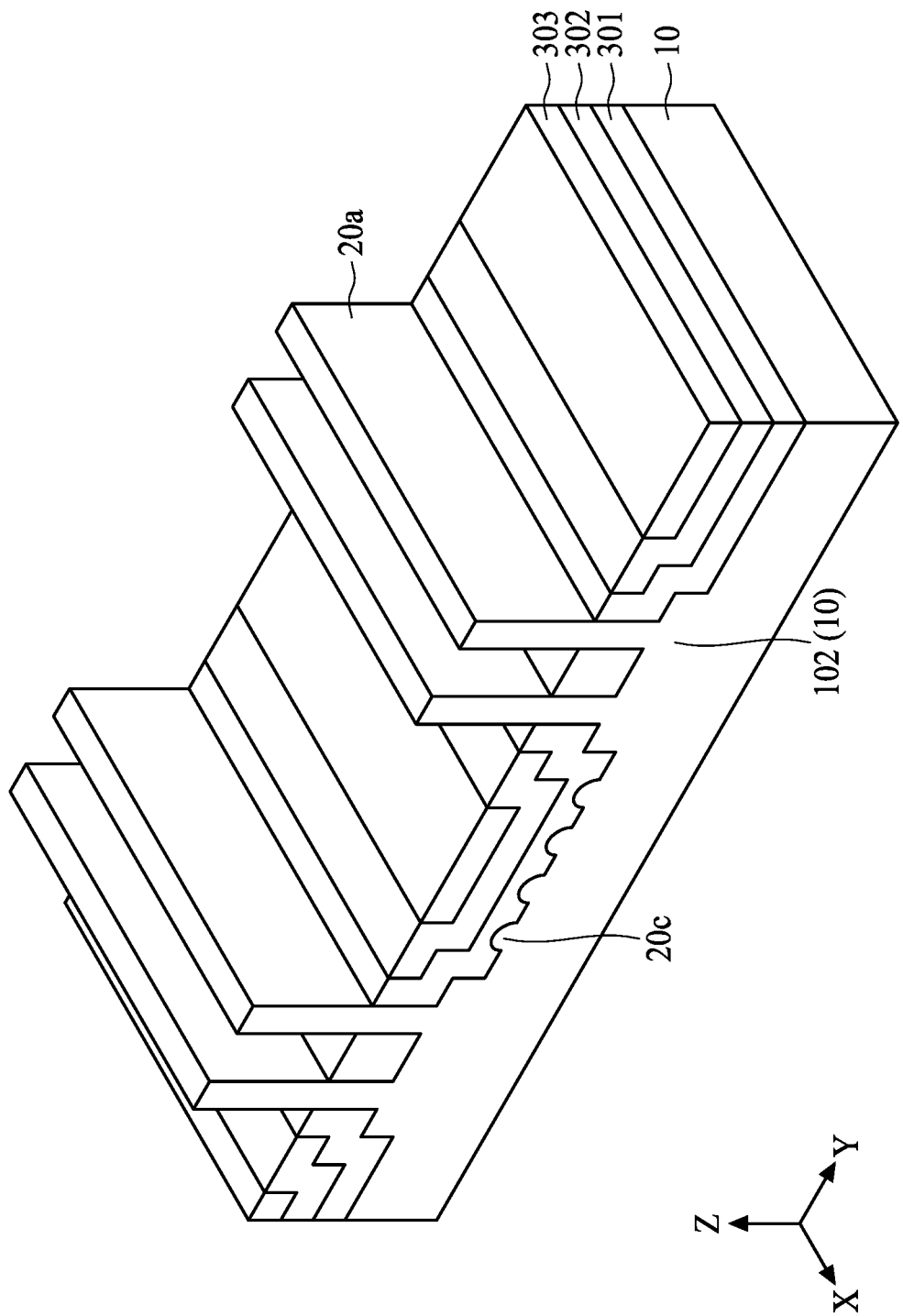
FIGS. 11 to 12 are perspective diagrams of various steps of a method for manufacturing a semiconductor structure in accordance with some embodiments of the present disclosure.

FIG. 11 shows a perspective view of the intermediate structure shown in FIG. 10. At least portions of the fin structures 20a are exposed through the first dielectric layer 301, the second dielectric layer 302 and the third dielectric layer 303. The fin structures 20a are substantially parallel with each other, and the plurality of fin structures 20a extends longitudinally along an X direction.

Figure 12:
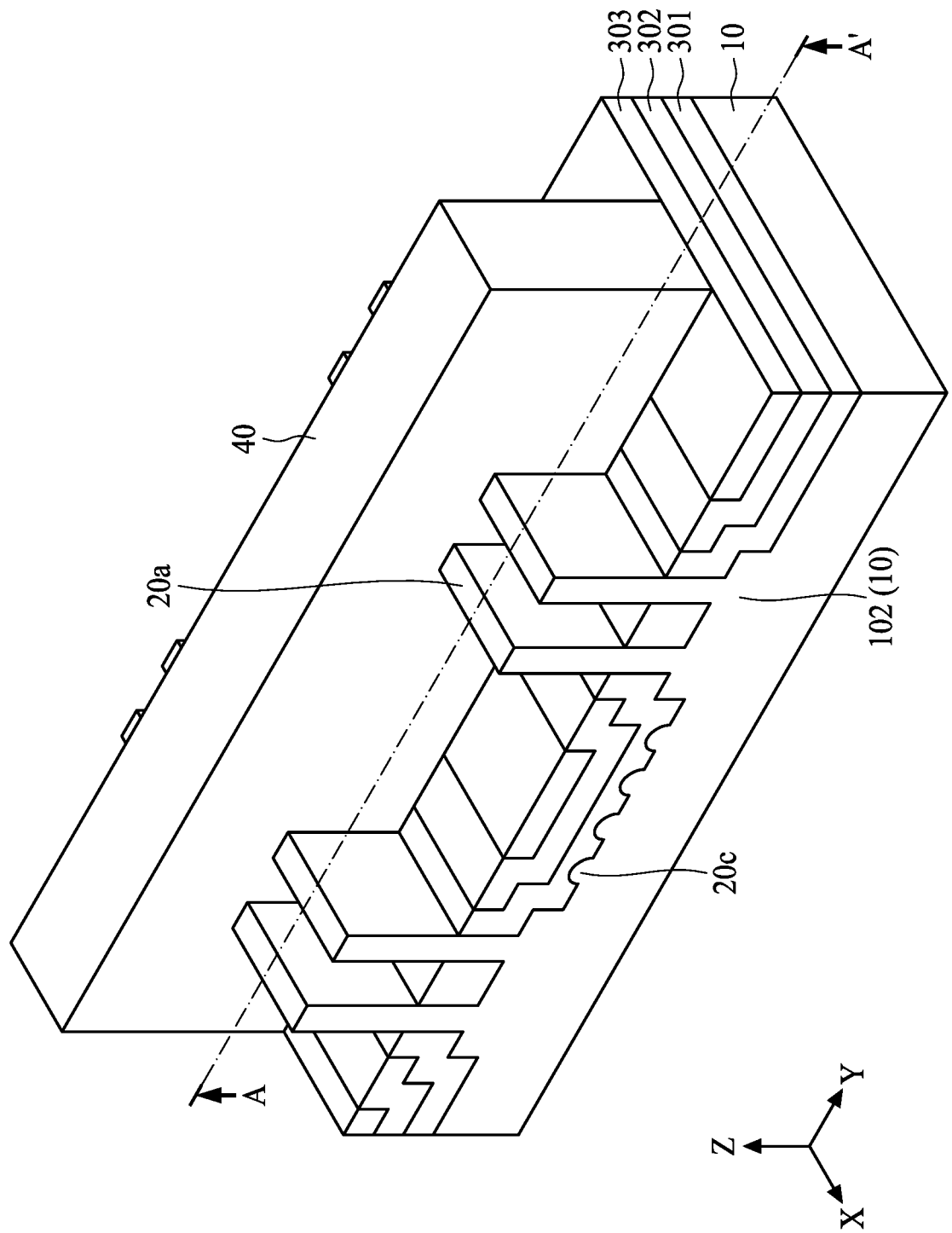

Referring to FIG. 12, a gate structure 40 is formed over the substrate 10 and across the fin structures 20a. In some embodiments, the gate structure 40 extends substantially perpendicular to the fin structures 20a. The gate structure 40 extends along Y direction and perpendicular to the X direction. In some embodiments, the gate structure 40 is formed over and across the fin structures 20a and the isolation structure between the active regions R1. In some embodiments, the gate structure 40 includes a polysilicon gate or a metal gate. In some embodiments, the gate structure 40 at this stage can be a dummy gate, which is to be replaced by a metal gate after formation of an interlayer dielectric (ILD) layer (will be detailed below) filling spaces between the gate structures 40 over the substrate 10. Conventional techniques can be applied in formation of the gate structure 40, and the formation of the gate structure 40 is not limited herein.

FIGS. 13 to 19 are cross-sectional diagrams cutting on a line A-A' along the Y direction shown in FIG. 12 in accordance with one or more embodiments to illustrate the operation O107 and optional operations of the method M10 and the operation O204 and optional operations of the method M20.

Figure 13:
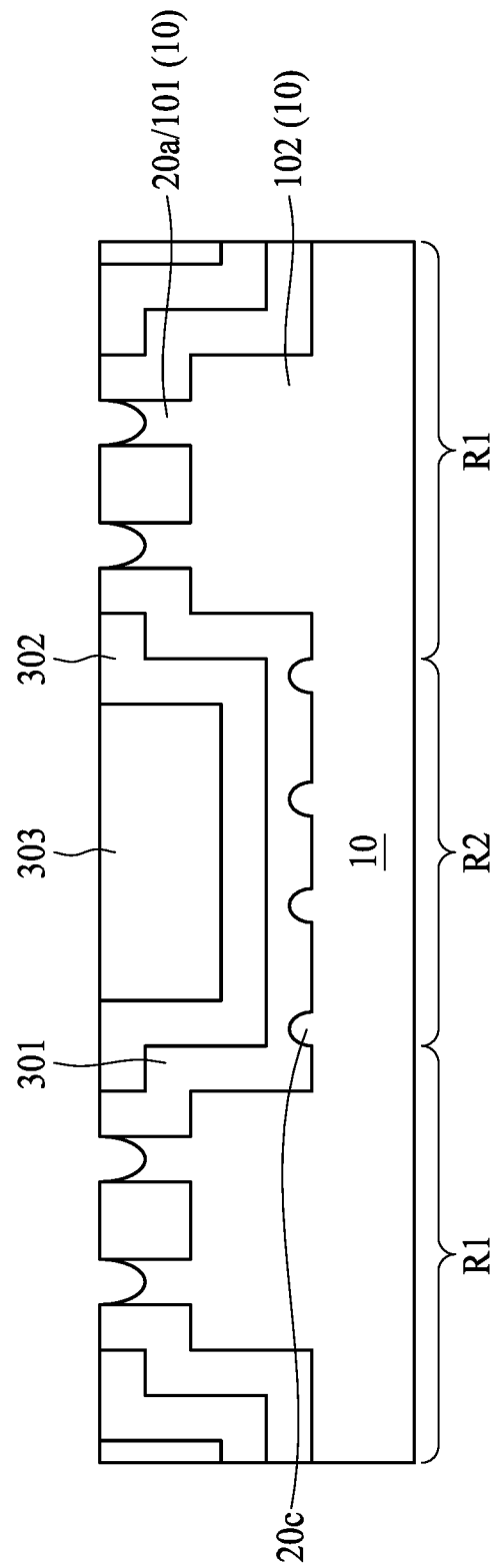
FIGS. 13 to 15 are cross-sectional diagrams of various steps of a method for manufacturing a semiconductor structure in accordance with some embodiments of the present disclosure.
Figure 14:
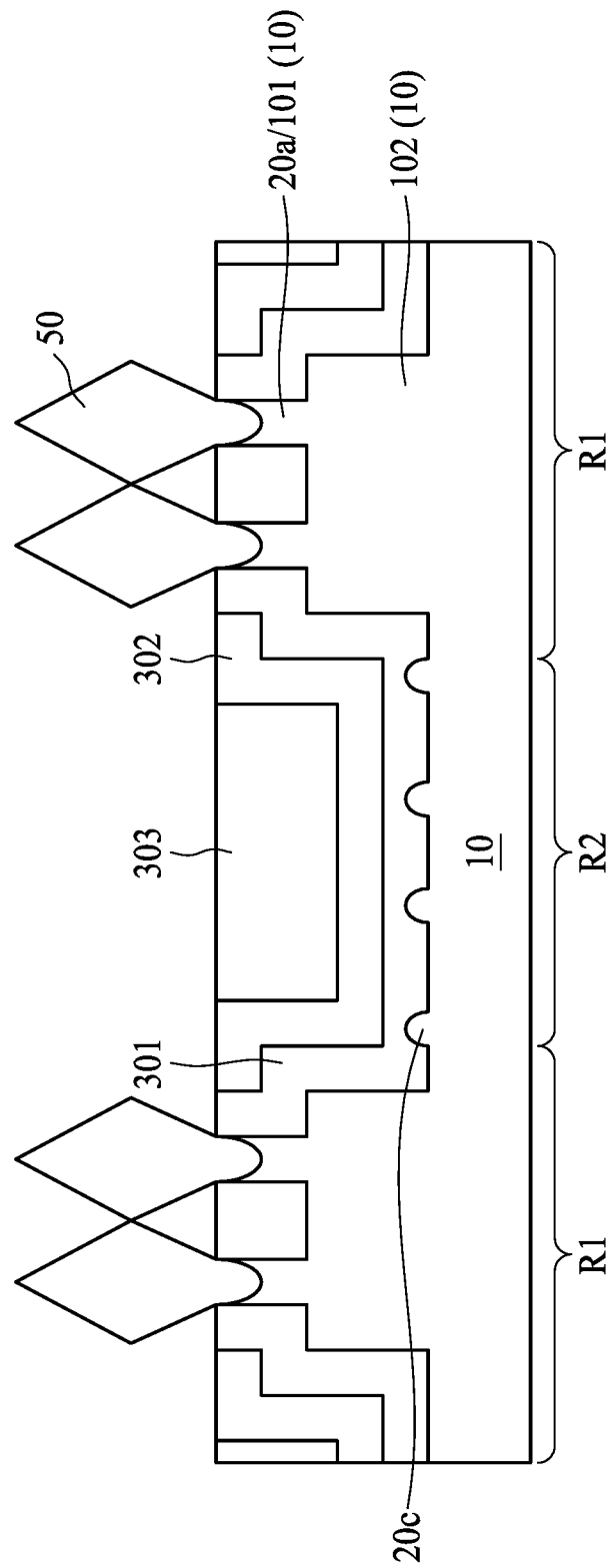

Referring to FIGS. 13 to 14, portions of the fin structures 20a are removed, and a plurality of source/drain structures 50 are formed. In some embodiments, the portions of the fin structures 20a above the isolation structures are removed. In some embodiments, the portions of the fin structures 20a are removed using the gate structure 40 as a mask. In some embodiments, the source/drain structures 50 are formed over the removed portions of the fin structures 20a. In some embodiments, the source/drain structures 50 are adjacent to the gate structure 40. In some embodiments, the source/drain structures 50 are formed by an epitaxial growth. In some embodiments, the source/drain structures 50 are epitaxial structures. In some embodiments, the source/drain structures 50 include germanium (Ge), silicon germanium (SiGe), silicon carbide (SiC), silicon phosphorus (SiP), silicon germanium carbon (SiGeC), silicon carbon phosphorus (SiCP) or other suitable materials.

Figure 15:
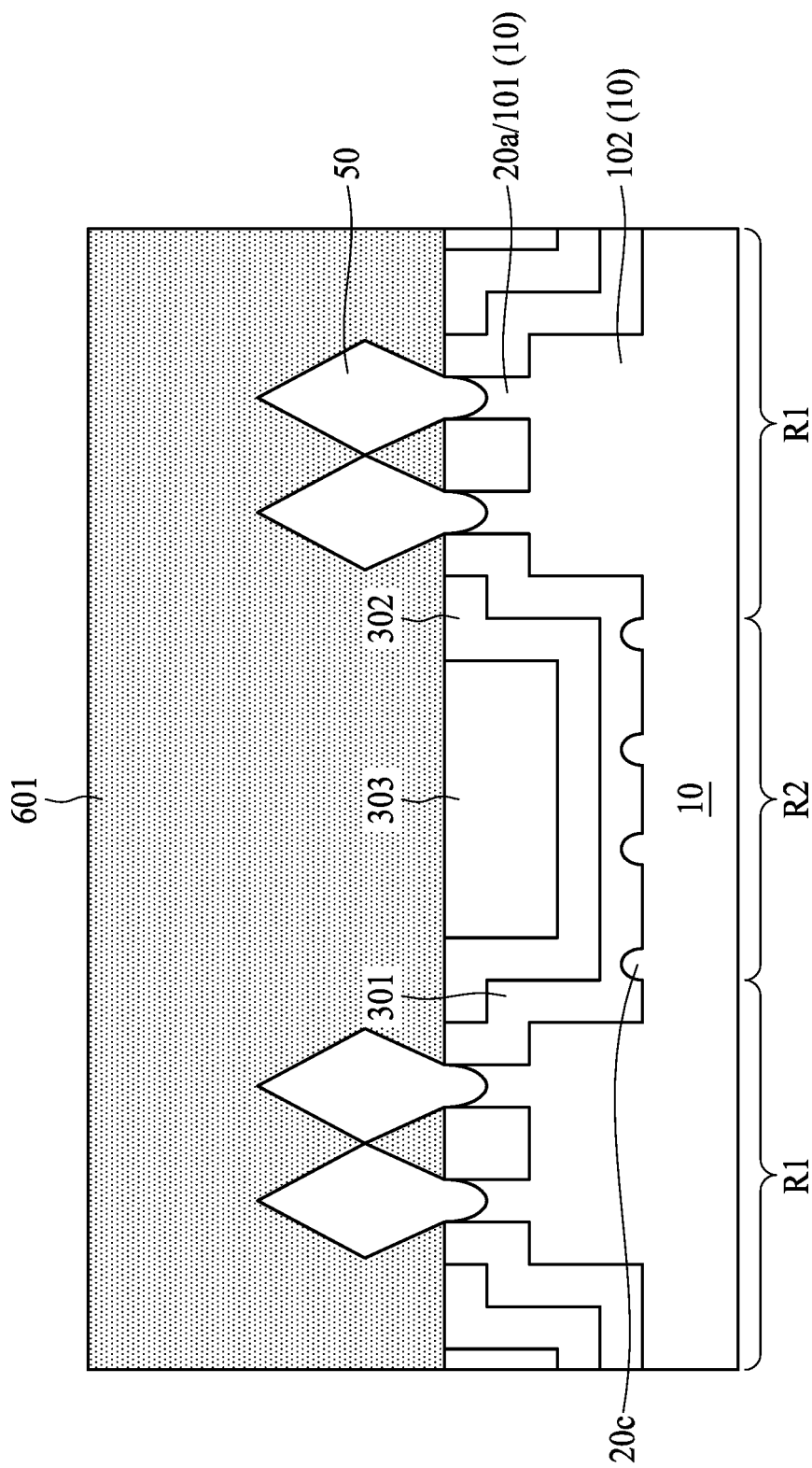

Referring to FIG. 15, a first interlayer dielectric (ILD) layer 601 is formed over the isolation structure (including the first dielectric layer 301, the second dielectric layer 302 and the third dielectric layer 303). In some embodiments, the first ILD layer 601 is formed covering and surrounding the source/drain structures 50. In some embodiments, the first ILD layer 601 has an etching rate different from the etching rate of the second dielectric layer 302 with respect to the etchant. In some embodiments, the etching rate of the first ILD layer 601 is similar to or substantially same as the etching rate of the third dielectric layer 303. In some embodiments, the first ILD layer 601 includes oxide.

Figure 16:
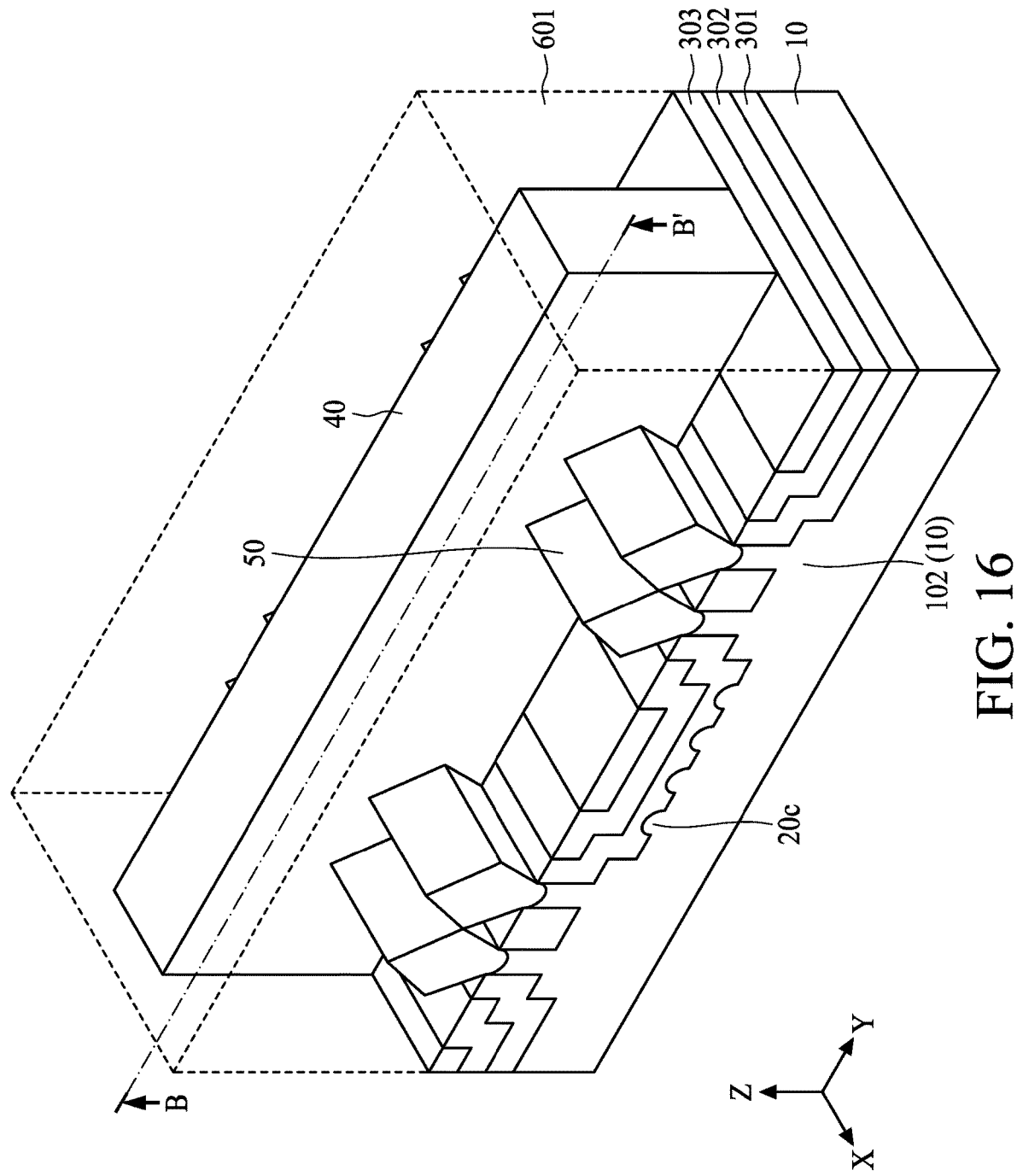
FIG. 16 is a perspective diagram of one or more steps of a method for manufacturing a semiconductor structure in accordance with some embodiments of the present disclosure.

FIG. 16 is a perspective diagram of the intermediate structure of FIG. 15, wherein the first ILD layer 601 is shown in dashed lines for ease of illustration. In some embodiments, the first ILD layer 601 also covers the gate structure 40. In some embodiments, the first ILD layer 601 surrounds the gate structure 40.

FIGS. 17 to 20 are cross-sectional diagrams cut on a line B-B' along the Y direction on the source/drain structures 50 shown in FIG. 16 in accordance with one or more embodiments to illustrate the operations O108 to O109 and optional operations of the method M10 and the operations O205 to O206 and optional operations of the method M20.

Figure 17:
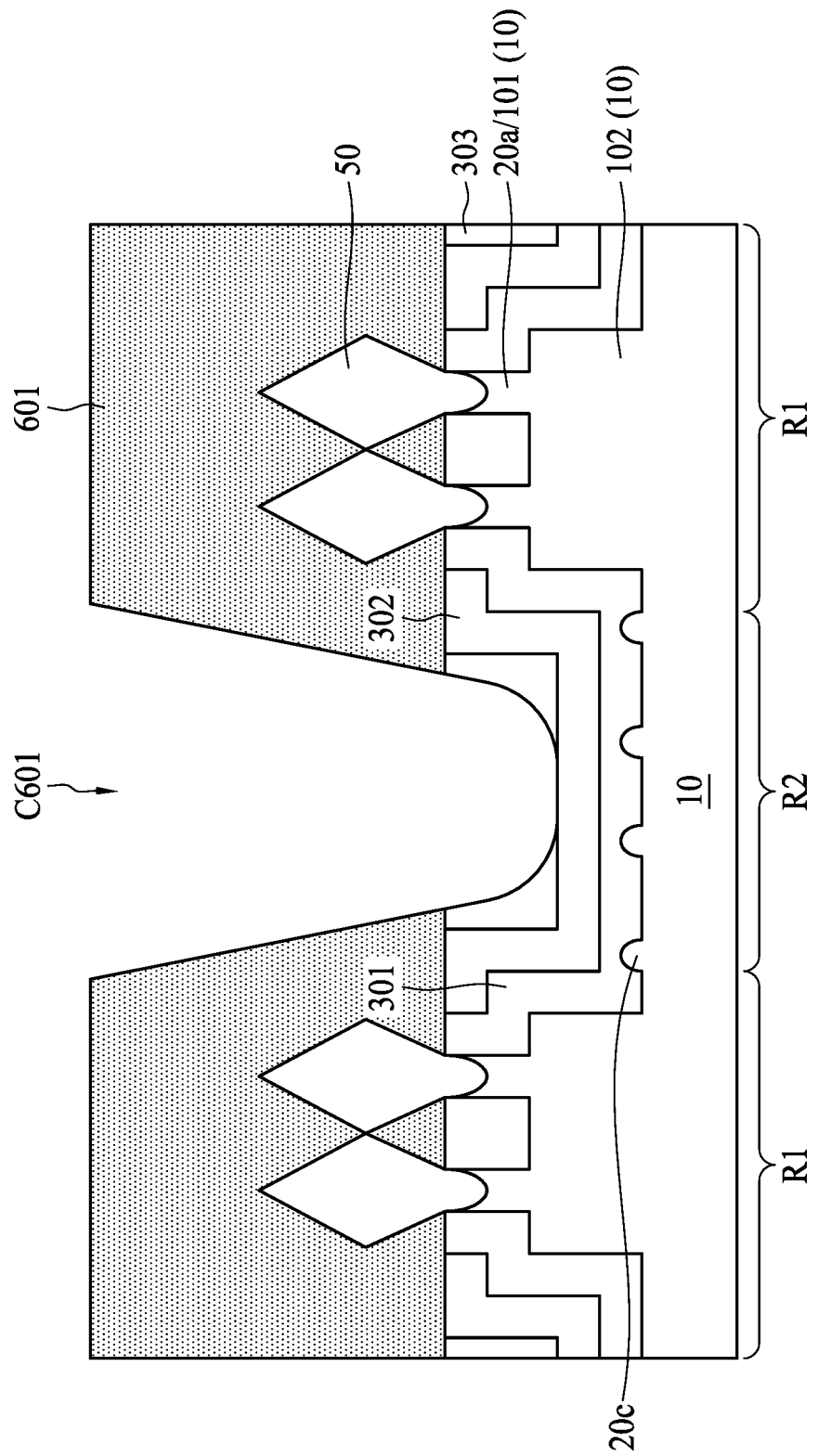
FIGS. 17 to 21 are cross-sectional diagrams of various steps of a method for manufacturing a semiconductor structure in accordance with some embodiments of the present disclosure.

Referring to FIG. 17, a portion of the first ILD layer 601 above the micro-fins 20c in the peripheral region R2 is removed. In some embodiments, an etching operation is performed on the first ILD layer 601 to remove the portion of the first ILD layer 601 between the active regions R1. In some embodiments, a recess C601 in the first ILD layer 601 is formed by the etching operation. In some embodiments, the recess C601 overlaps the micro-fins 20c from a top view perspective. In some embodiments, the etching operation removes a portion of the third dielectric layer 303 above the micro-fins 20c in the peripheral region R2. In some embodiments, a portion of the recess C601 is formed in the third dielectric layer 303. In some embodiments, the second dielectric layer 302 functions as an etch stop layer in the etching operation, and the recess C601 reaches and stops at the second dielectric layer 302. In some embodiments, the recess C601 exposes a portion of the second dielectric layer 302. In some embodiments, a bottom of the recess C601 is lower than bottoms of the source/drain structures 50.

Figure 18:
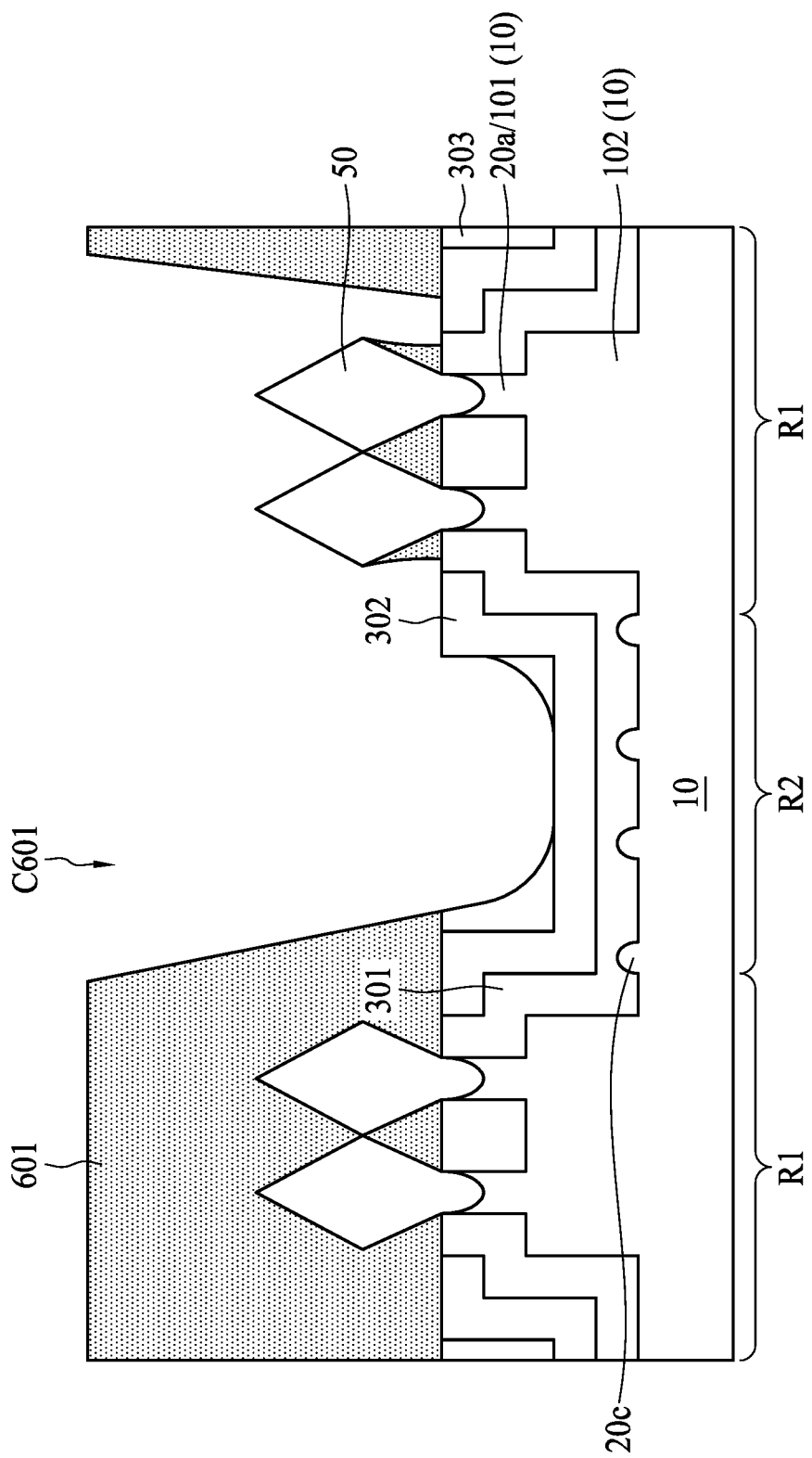

In some embodiments, the recess C601 is formed only in the peripheral region R2. In some embodiments, the recess C601 is formed in the peripheral region R2 and the adjacent active region R1 in order to form a contact (to be formed) to electrically connect to the source/drain structures 50. In some embodiments, as shown in FIG. 18, the recess C601 is formed to expose at least tops of the source/drain structures 50. In some embodiments, the recess C601 is formed by a dry etching operation, and portions of the third dielectric layer 303 adjacent to corners or edges of the second dielectric layer 302 and portions of the first ILD layer 601 covered by the source/drain regions 50 may be left in place as shown in FIG. 18.

Figure 19:
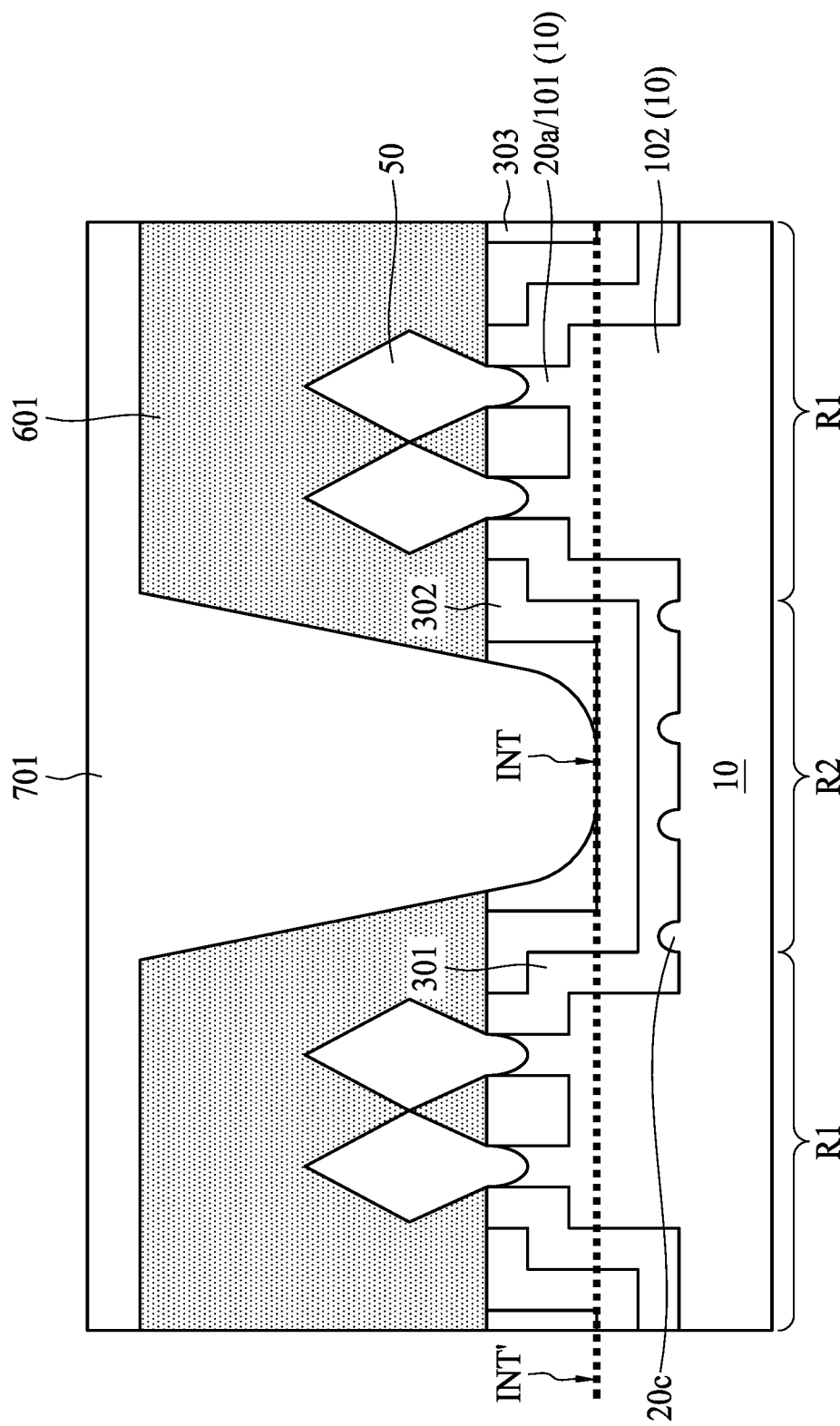
Figure 20:
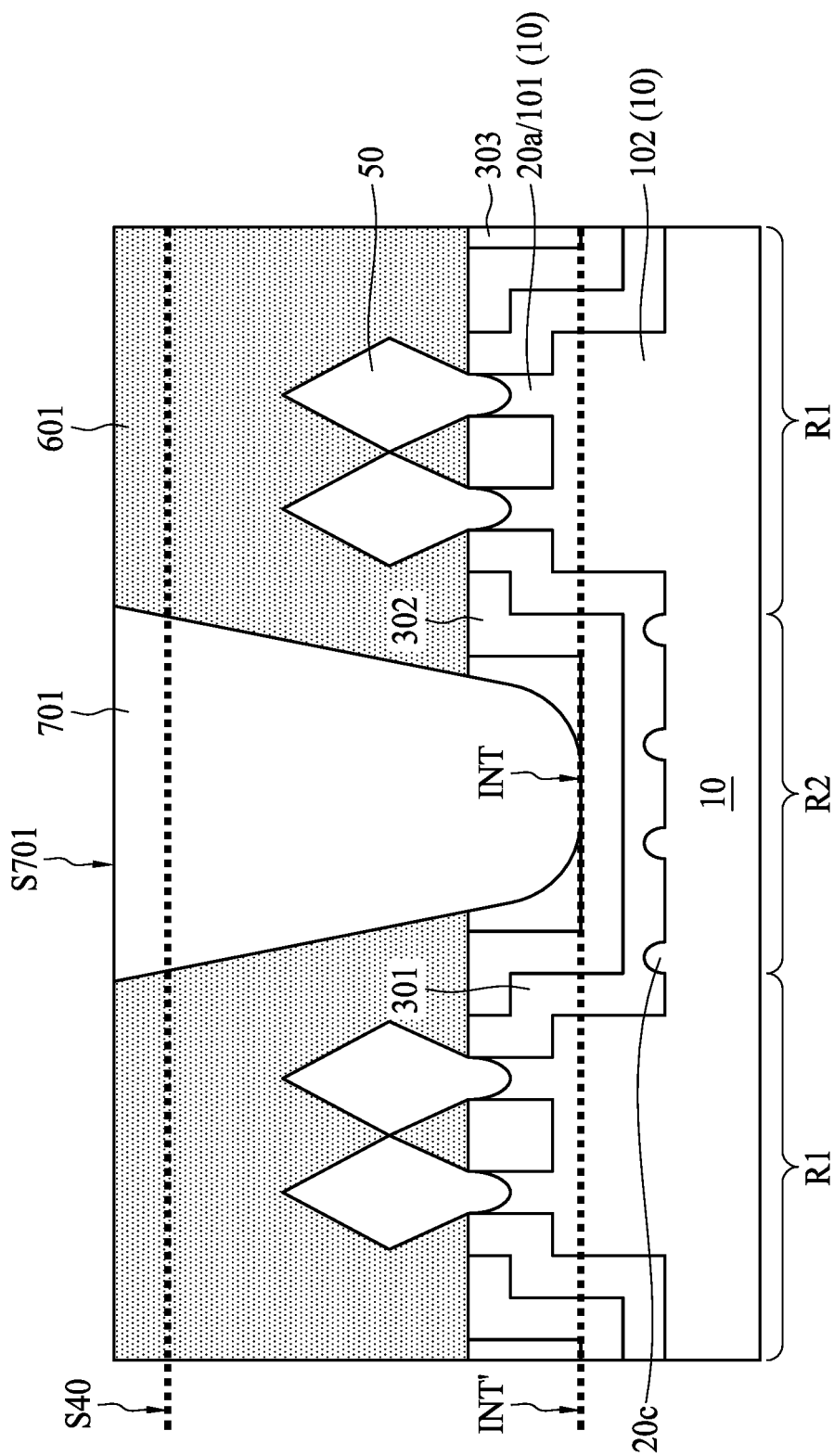

Referring to FIGS. 19 to 20, a first contact 701 is formed in the recess C601 of the first ILD layer 601 shown in FIG. 17 in accordance with some embodiments of the present disclosure. In some embodiments, the first contact 701 is disposed in the peripheral region R2 above the micro-fins 20c and separated from the micro-fins by at least the second dielectric layer 302. In some embodiments, the first contact 701 includes metallic material, conductive material or any other suitable material. In some embodiments, the first contact 701 is formed by electroplating or sputtering or other suitable techniques. In some embodiments, the first contact 701 is formed covering a top surface of the first ILD layer 601. In some embodiments, a planarization (e.g., CMP) is performed on the first ILD layer 601 and the first contact 701 shown in FIG. 19 to remove portions of the first contact 701 until the first ILD layer 601 is exposed as shown in FIG. 20. In some embodiments, a portion of the first ILD layer 601 is also removed. In some embodiments, the first contact 701 has a top surface substantially coplanar with a top surface of the first ILD layer 601 after the planarization. In some embodiments, a top surface S701 of the first contact 701 is over a top surface S40 of the gate structure 40 (the gate structure 40 cannot be seen in FIG. 20, and the top surface S40 of the gate structure 40 is shown as dotted lines to for illustration). In some embodiments, the first contact 701 is formed in the first ILD layer 601 and the third dielectric layer 303. In some embodiments, the first contact 701 is surrounded by the first ILD layer 601. In some embodiments, a bottom portion of the first contact 701 is surrounded by the third dielectric layer 303. In some embodiments, an extension surface INT' of the interface INT (the extension surface INT' is a plane that extends beyond the interface INT for illustration but is not an actual or physical surface) of the contact 701 and the second dielectric layer 302 is between a bottom of the source/drain structures 50 and the micro-fins 20c. Other details of a position of the first contact 701 relative to other elements should be similar to those of the recess C601, and repeated description is omitted herein.

In some embodiments, prior to the formation of the first contact 701 and after the exposure of the source/drain structures 50 (for instance, after at least partial exposure of the source/drain structures 50 through the first ILD layer 601 as shown in FIG. 18), a silicide formation is performed to form a silicide layer on the exposed portions of the source/drain structures 50.

Figure 21:
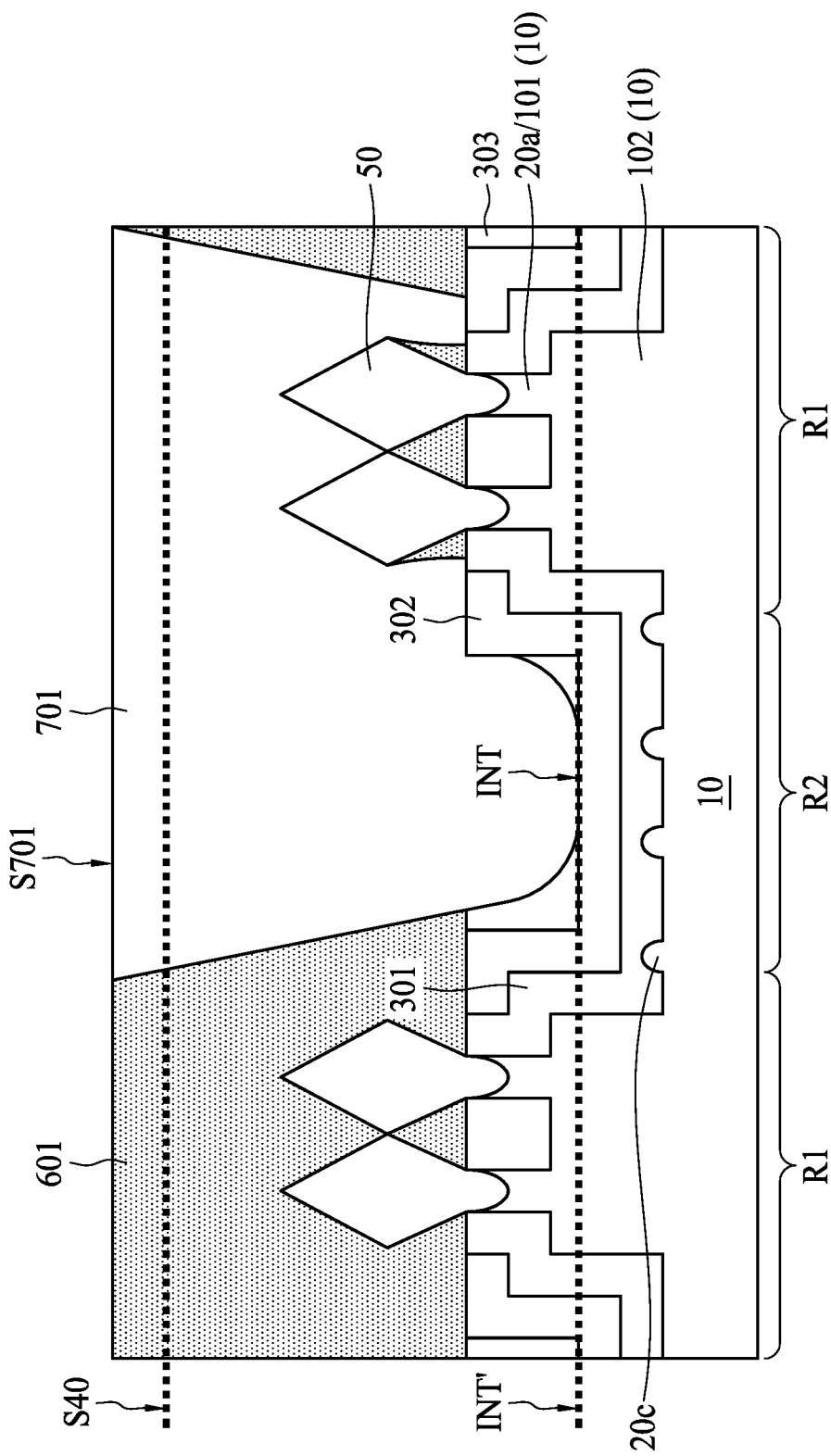

Referring to FIG. 21, operations related to those shown in FIGS. 19 to 20 are performed on the intermediate structure shown in FIG. 18 in accordance with some embodiments of the present disclosure. In some embodiments, a first contact 701 is formed in the peripheral region R2 and in the adjacent one or more active regions R1. In some embodiments, the first contact 701 is electrically connected with one or more source/drain structures 50. In some embodiments, a silicide layer is formed between the first contact 701 and the source/drain structures 50. Other details of the first contact 701 relative to other elements should be similar to those of the recess C601 shown in FIG. 18 and the contact 701 shown in FIG. 20, and repeated description is omitted herein.

Figure 22:
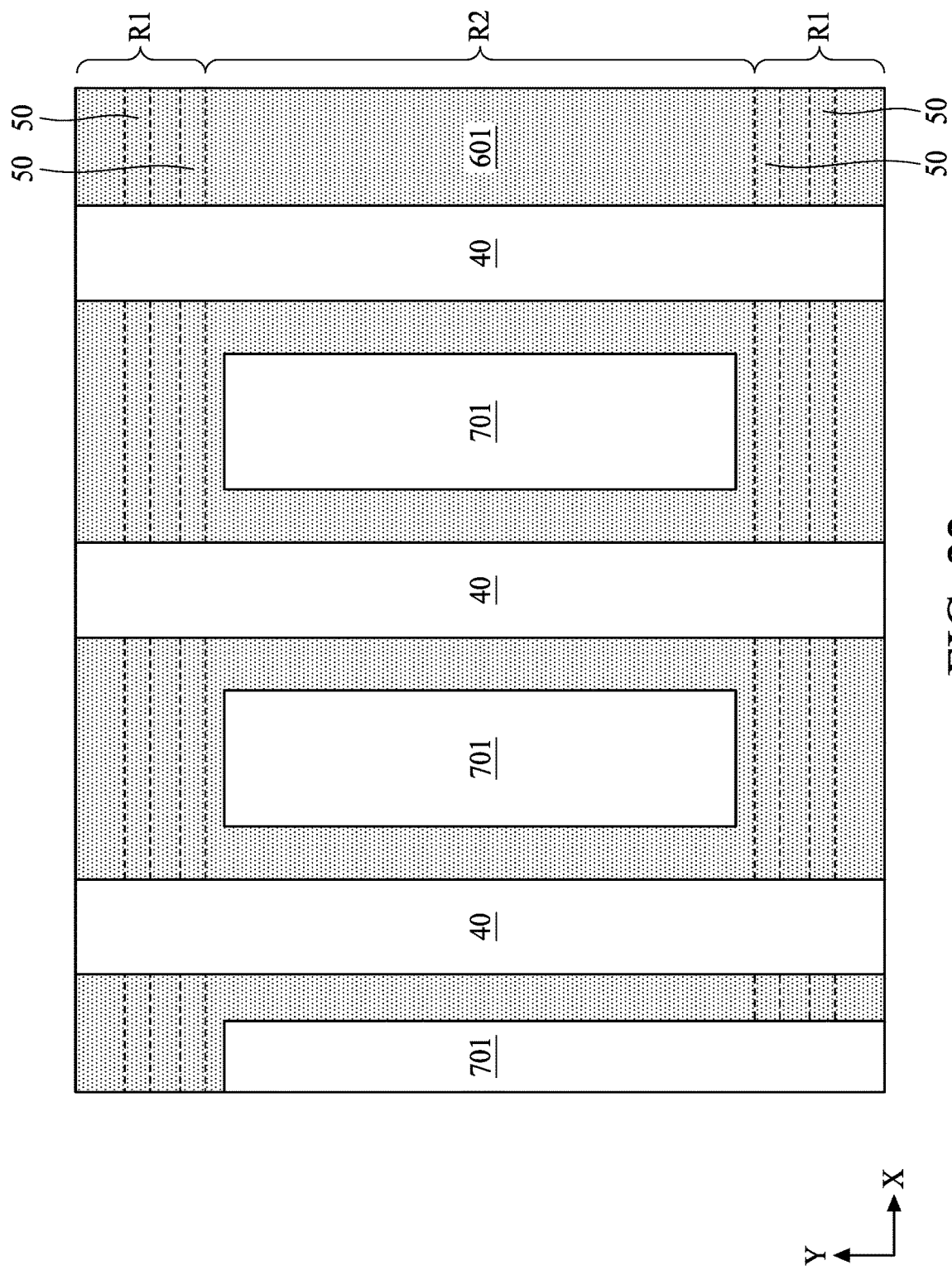
FIG. 22 is a top view of one or more steps of a method for manufacturing a semiconductor structure in accordance with some embodiments of the present disclosure.

FIG. 22 shows a top view of an intermediate structure at a stage after formation of the first contact 701 as shown in FIG. 20 and FIG. 21 in accordance with some embodiments. In some embodiments, the first contact 701 and the gate structure 40 extend longitudinally along the Y direction. The first contact 701 extends in parallel to the gate structure 40. In some embodiments, the first contact 701 is between the gate structures 40. In some embodiments, the first contact 701 is also between the source/drain structures 50. In some embodiments, the first contact 701 is disposed over and across the source/drain structures 50. In some embodiments, a cross-sectional view of the first contact 701 on the left hand side of FIG. 22 is similar to FIG. 21, and cross-sectional views of the two first contacts 701 on the right hand side of FIG. 22 are similar to FIG. 20.

Figure 23:
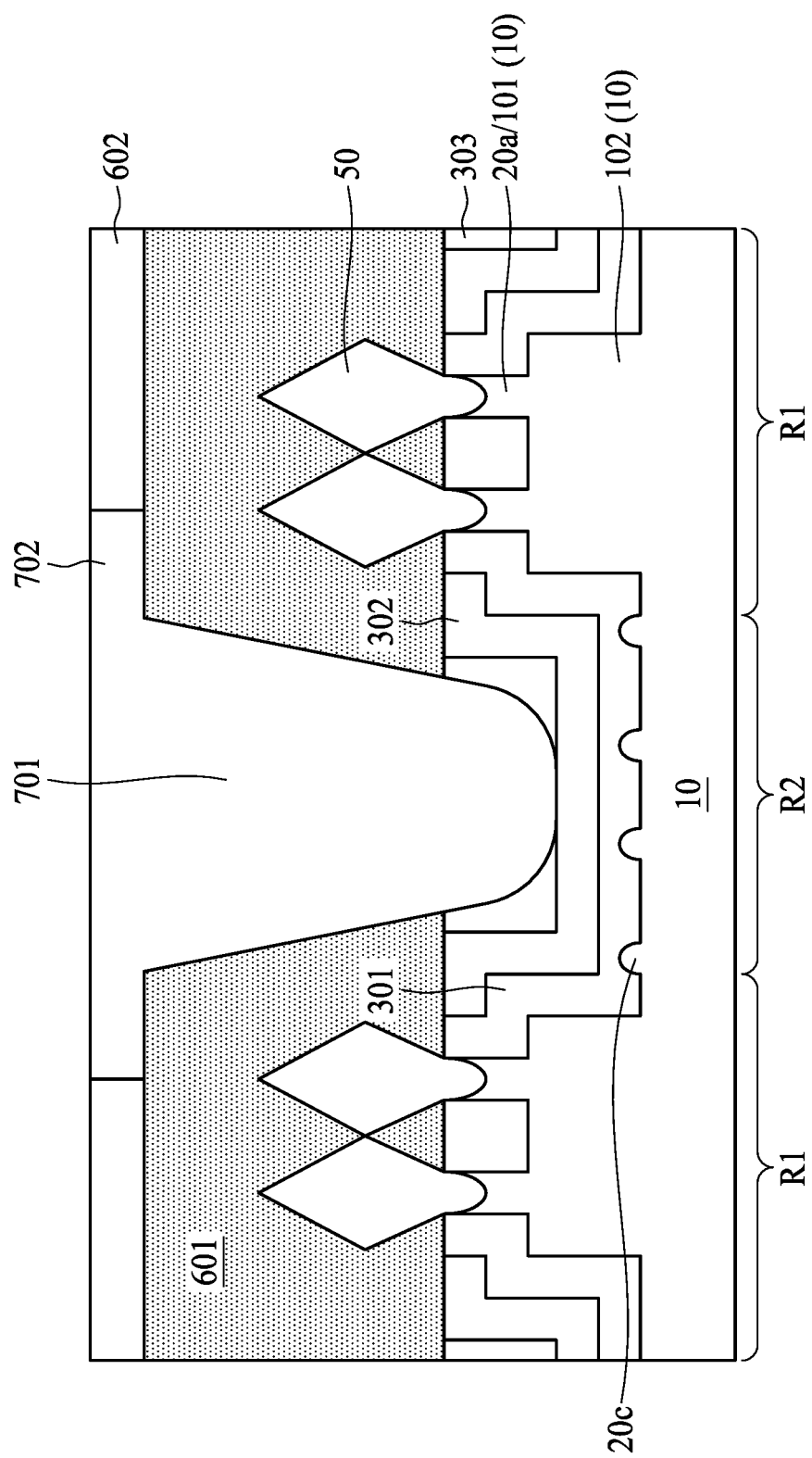
FIG. 23 is a cross-sectional diagram of one or more steps of a method for manufacturing a semiconductor structure in accordance with some embodiments of the present disclosure.

Referring to FIG. 23, a second ILD layer 602 is further formed over the first contact 701 and the first ILD layer 601, and a second contact 702 is further formed in the second ILD layer 602 electrically connected to the first contact 701. In some embodiments, the second ILD layer 602 as shown in FIG. 23 is formed on the intermediate structure of FIG. 20. In some embodiments, the second ILD layer 602 is formed on the intermediate structure of FIG. 21. In some embodiments, a deposition operation is performed to form the second ILD layer 602. In some embodiments, an etching operation for removing a portion of the second ILD layer 602, a metal fill operation for forming the second contact 702 in the second ILD layer 602, and a planarization on the second contact 702 and the second ILD layer 602 are sequentially performed. Techniques used in the formation of the second ILD layer 602 and the second contact 702 can be similar to those used in the formation of the first ILD layer 601 and the first contact 701.

The first contact 701 formed in the recess C601 is for electrical connection to an interconnect structure of a semiconductor device. A larger recess C601 can provide a larger process window in formation of the electrical connection between the source/drain structures 50 and the interconnect structure. In some embodiments, the interconnect structure is to be formed above the source/drain structures 50 and the gate structure 40.

In order to further illustrate the method M10 and the method M20, illustration of other embodiments are provided with the accompanying figures. FIGS. 24 to 31 are cross-sectional and perspective diagrams in accordance with some embodiments of the present disclosure. In the following illustration and figures, elements with similar or same functions or properties are repeatedly used. The elements with same reference numerals may have features similar to features of elements illustrated above, and repeat description is omitted.

Figure 24:
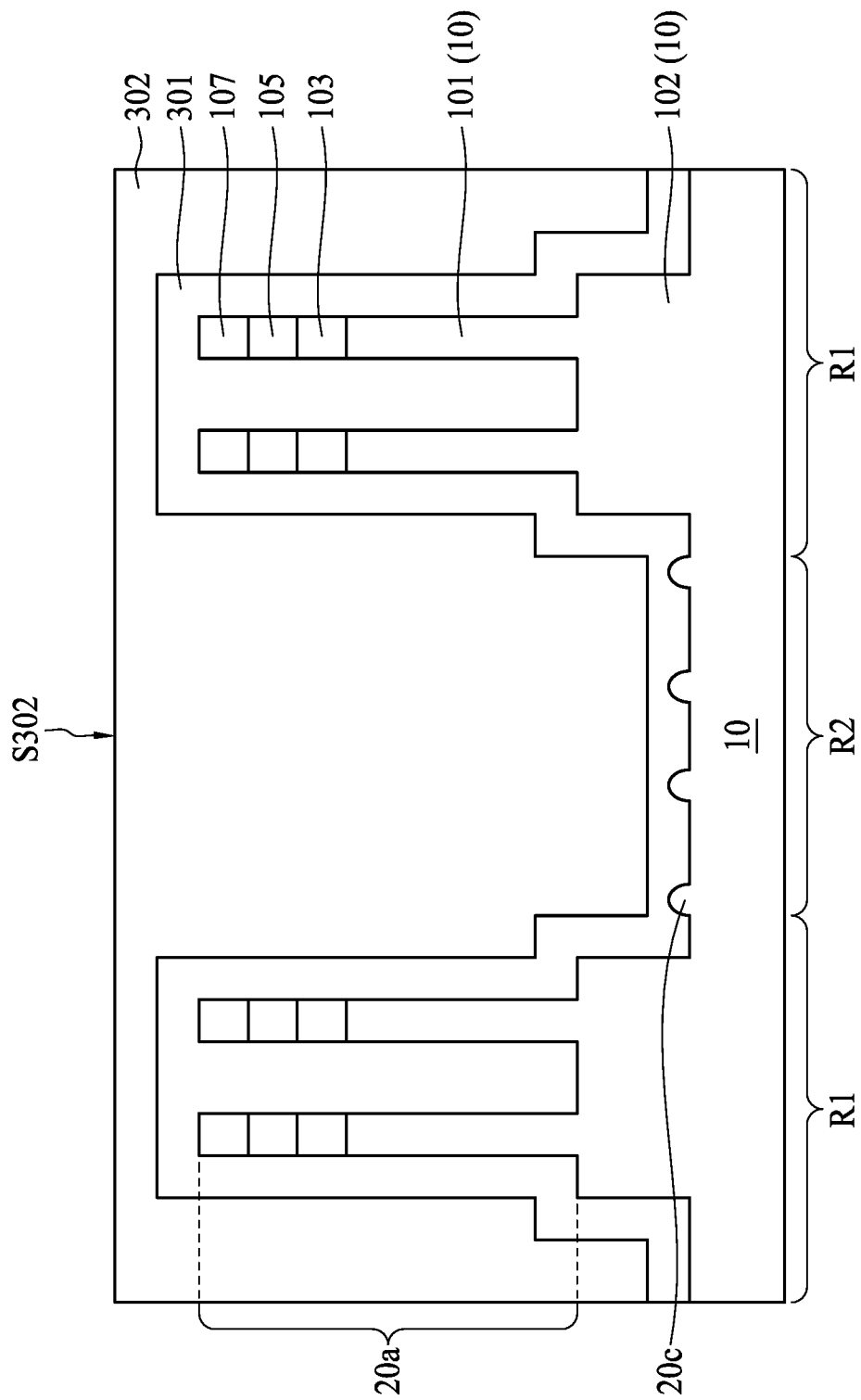
FIGS. 24 to 25 are cross-sectional diagrams of various steps of a method for manufacturing a semiconductor structure in accordance with some embodiments of the present disclosure.

Referring to FIG. 24, operations related to those shown in FIGS. 3 to 7 are performed, and the second dielectric layer 302 is formed over the first dielectric layer 301 without formation of the third dielectric layer 303. In some embodiments, the second dielectric layer 302 is formed by a blanket deposition. In some embodiments, the second dielectric layer 302 is disposed over the second fin structures 20a and has a first top surface S302 being a substantially planar surface. In some embodiments, a thickness of the second dielectric layer 302 is in a range of 120 to 200 nm.

Figure 25:
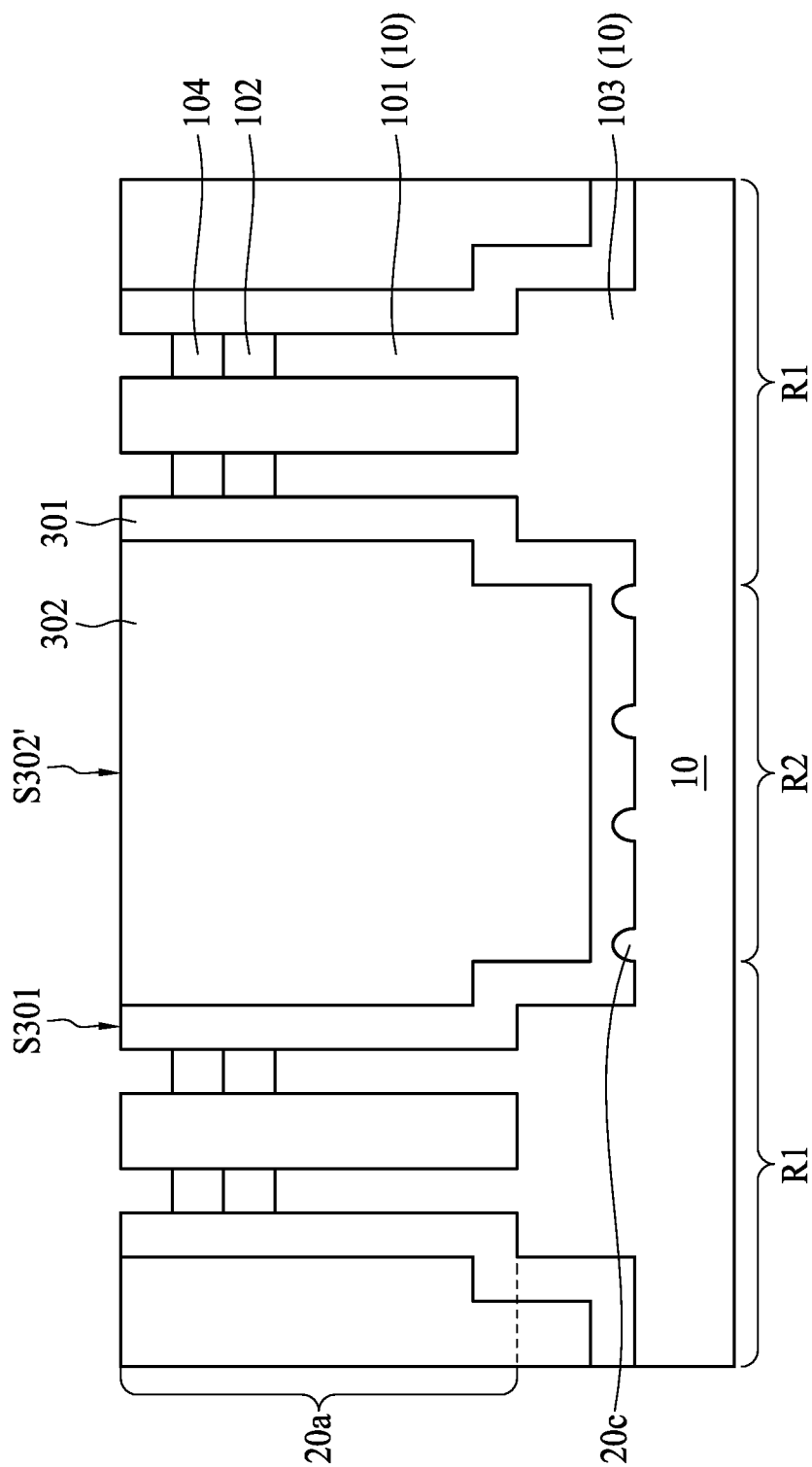

Referring to FIG. 25, operations related to those shown in FIGS. 8 to 9 are performed on the intermediate structure shown in FIG. 24. In some embodiments, an etching rate of the second dielectric layer 302 is different from an etching rate of a hard mask layer 107. In some embodiments, the hard mask layer 107 is removed, and a second top surface S302' of the second dielectric layer 302 is formed and substantially coplanar with a top surface S301 of the first dielectric layer 301 at this stage.

Figure 26:
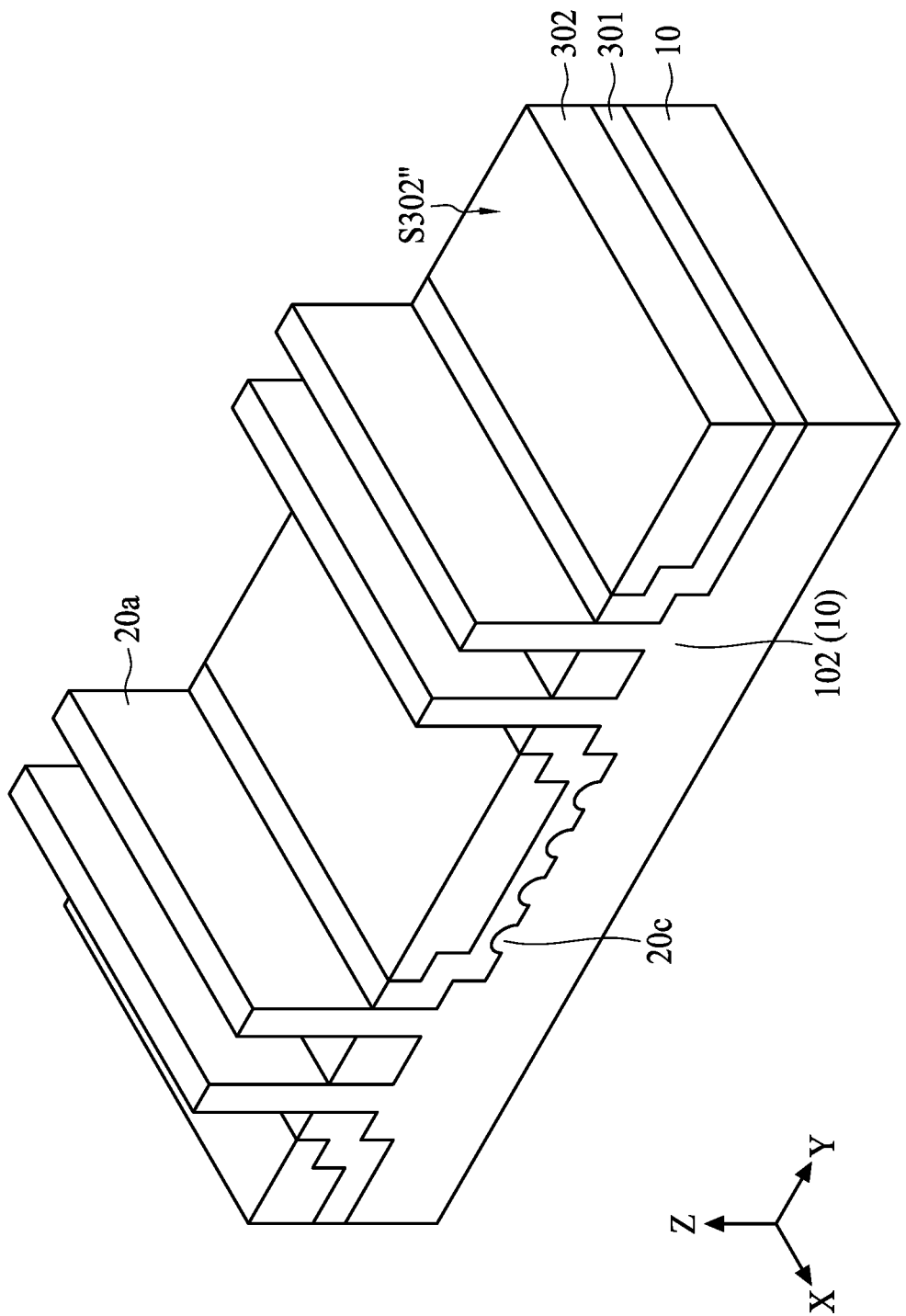
FIGS. 26 to 27 are perspective diagrams of various steps of a method for manufacturing a semiconductor structure in accordance with some embodiments of the present disclosure.
Figure 27:
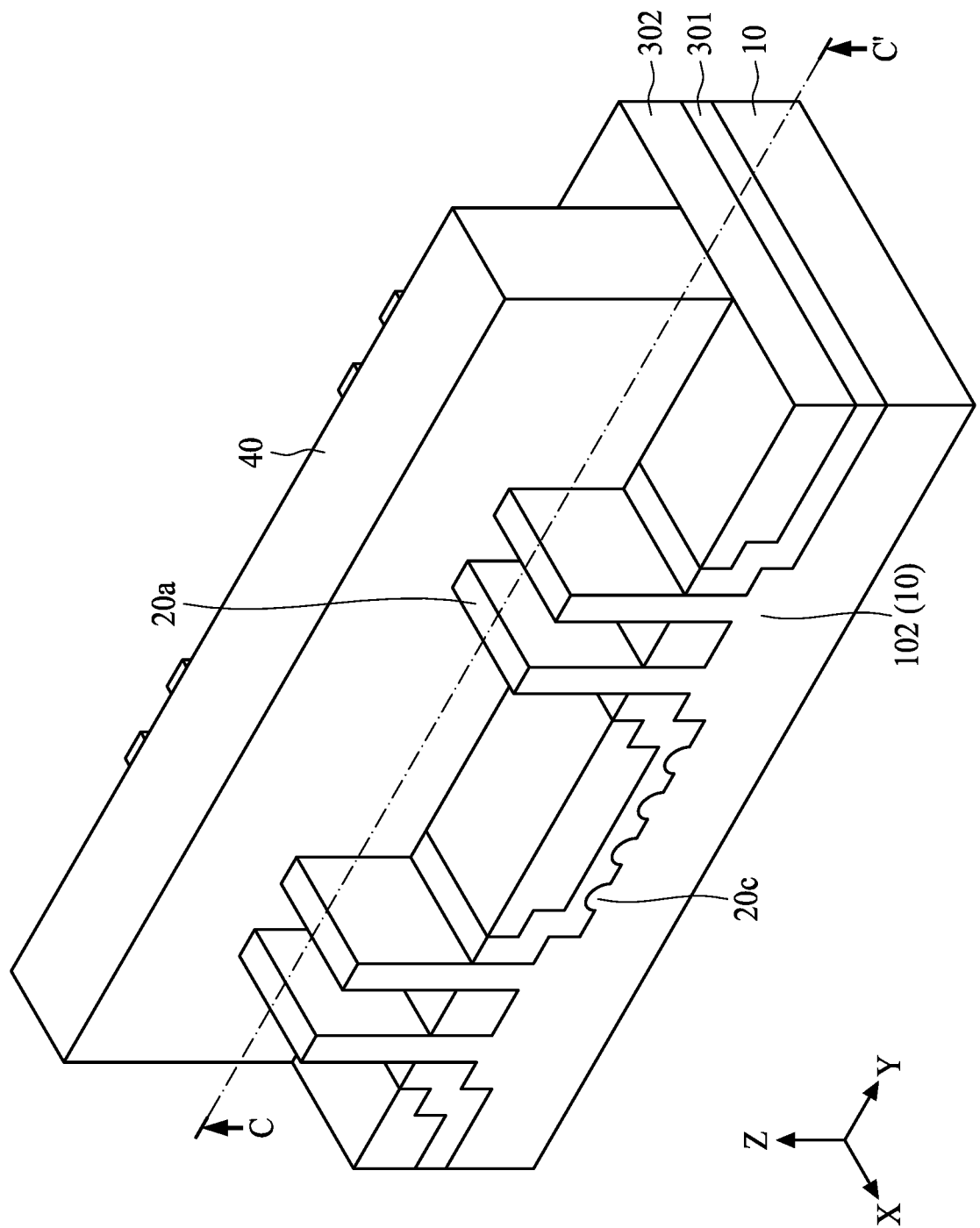

Referring to FIG. 26, operations related to those shown in FIGS. 10 to 11 are performed on the intermediate structure shown in FIG. 25. In addition, operations related to those shown in FIG. 12 are performed on the intermediate structure shown in FIG. 26 to form a structure as shown in FIG. 27. In some embodiments, a portion of the second dielectric layer 302 is further removed, and thus a third top surface S302" is formed. In some embodiments, the gate structure 40 is formed on the second dielectric layer 302 without the third dielectric layer 301 in between. In some embodiments, an isolation structure formed in the peripheral region R2 between the fin structures 20a includes only the first dielectric layer 301 and the second dielectric layer 302.

FIGS. 28 to 31 are cross-sectional diagrams cut on a line C-C' along the Y direction shown in FIG. 27 in accordance with one or more embodiments to illustrate the operation O107 and optional operations of the method M10 and the operation O204 and optional operations of the method M20.

Figure 28:
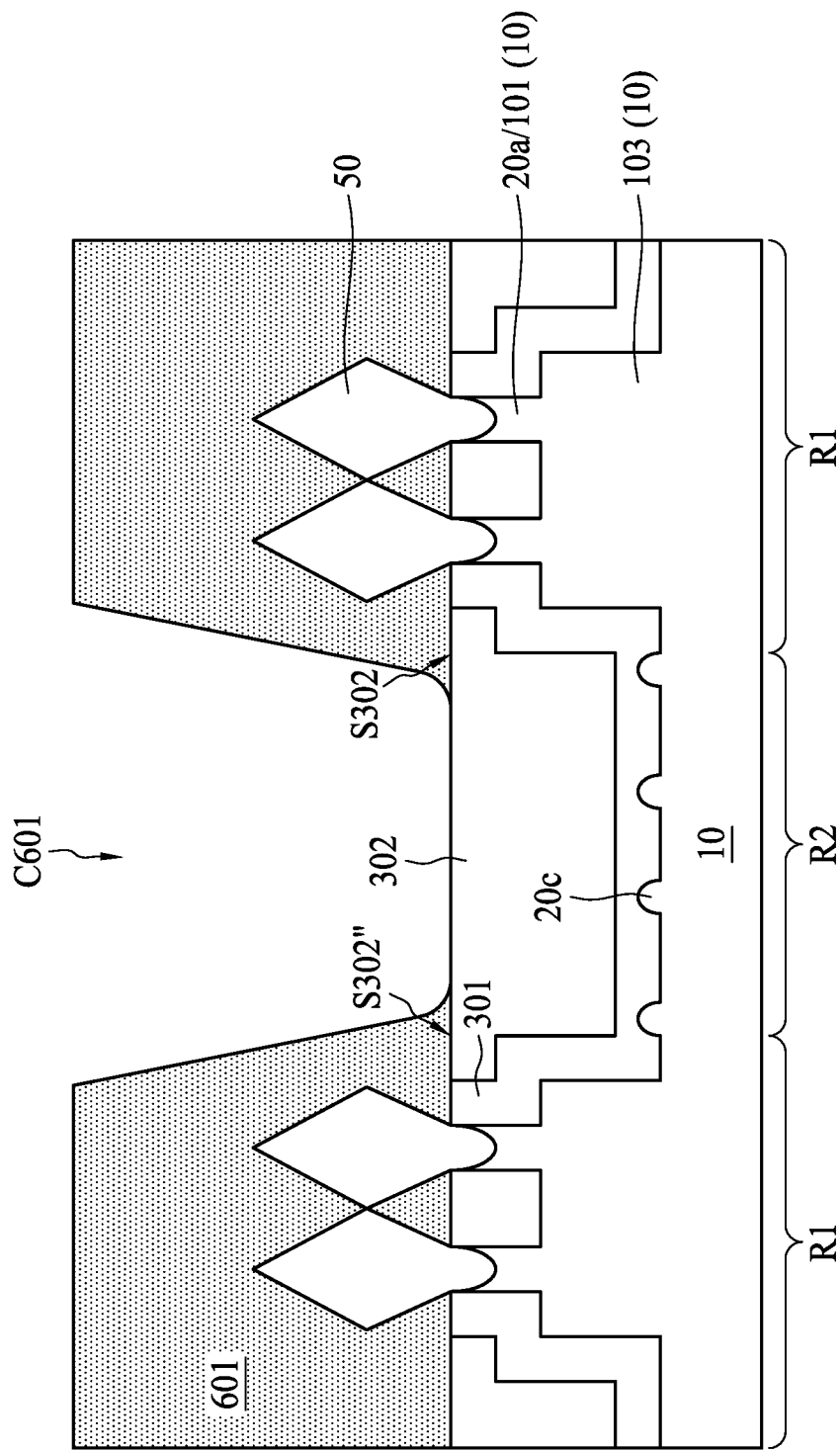
FIGS. 28 to 31 are cross-sectional diagrams of various steps of a method for manufacturing a semiconductor structure in accordance with some embodiments of the present disclosure.

Referring to FIG. 28, operations related to those shown in FIGS. 13 to 17 are performed on the intermediate structure shown in FIG. 27. In some embodiments, an etching operation to form the recess C601 stops at the second dielectric layer 302. In some embodiments, the recess C601 is formed over the isolation structure without extending partially through the isolation structure as shown in FIGS. 17 and 18. In some embodiments, a surficial portion of the second dielectric layer 302 is removed by the etching operation, and a bottom of the recess C601 is slightly lower than the third top surface S302" of the second dielectric layer 302. In some embodiments, the bottom of the recess C601 is above bottoms of the source/drain structures 50.

Figure 29:
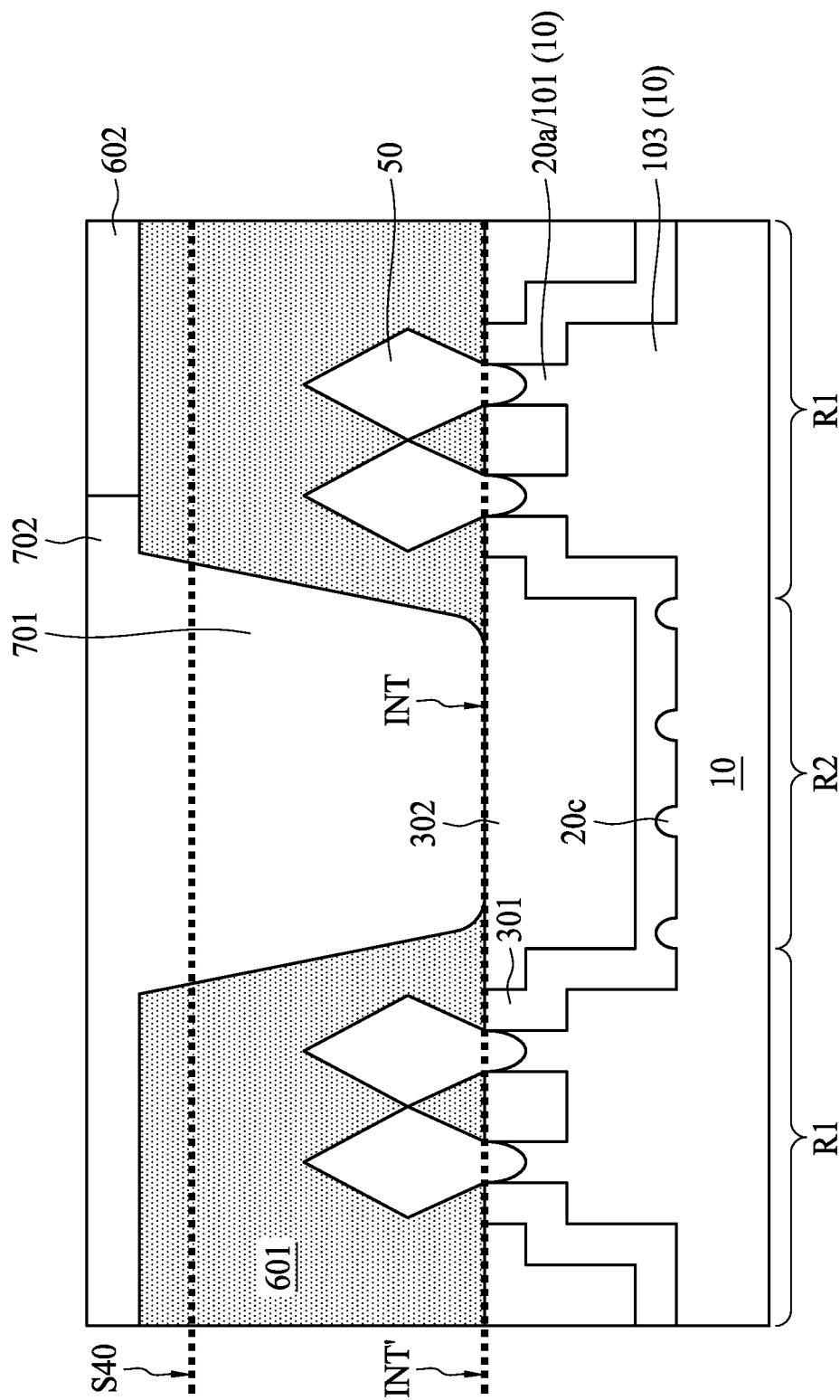

Referring to FIG. 29, operations related to those shown in FIGS. 19 to 20 and 22 are performed on the intermediate structure shown in FIG. 28. In some embodiments, a top view of an intermediate structure after formation of the first contact 701 is similar to the top view of FIG. 21. In some embodiments, an extension surface INT' of the interface INT of the first contact 701 and the second dielectric layer 302 passes through or intersects with the source/drain structures 50. In some embodiments, the bottoms of the source/drain structures 50 and the micro-fins 20c are at a same side of the extension surface INT' of the interface INT.

Figure 30:
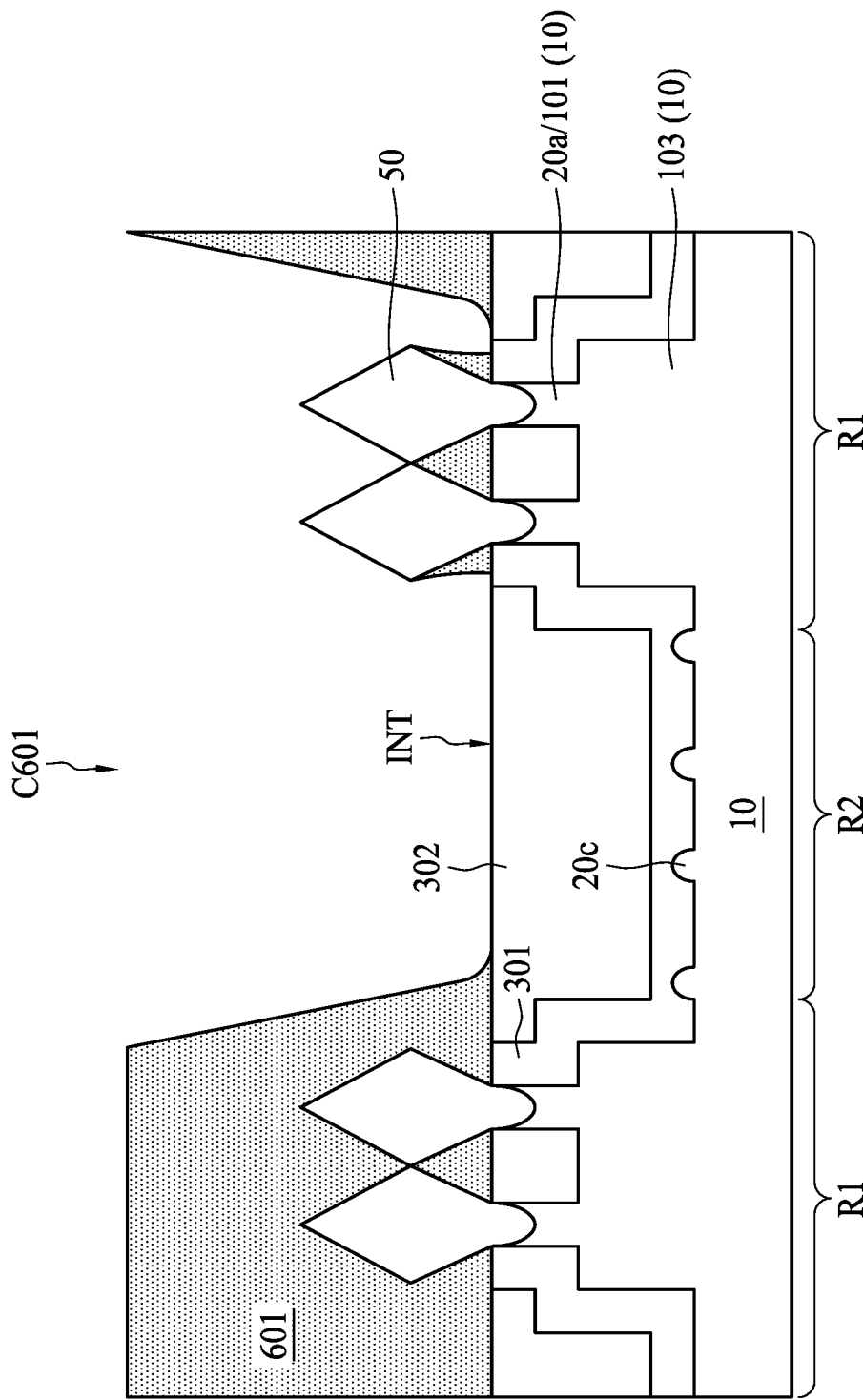
Figure 31:
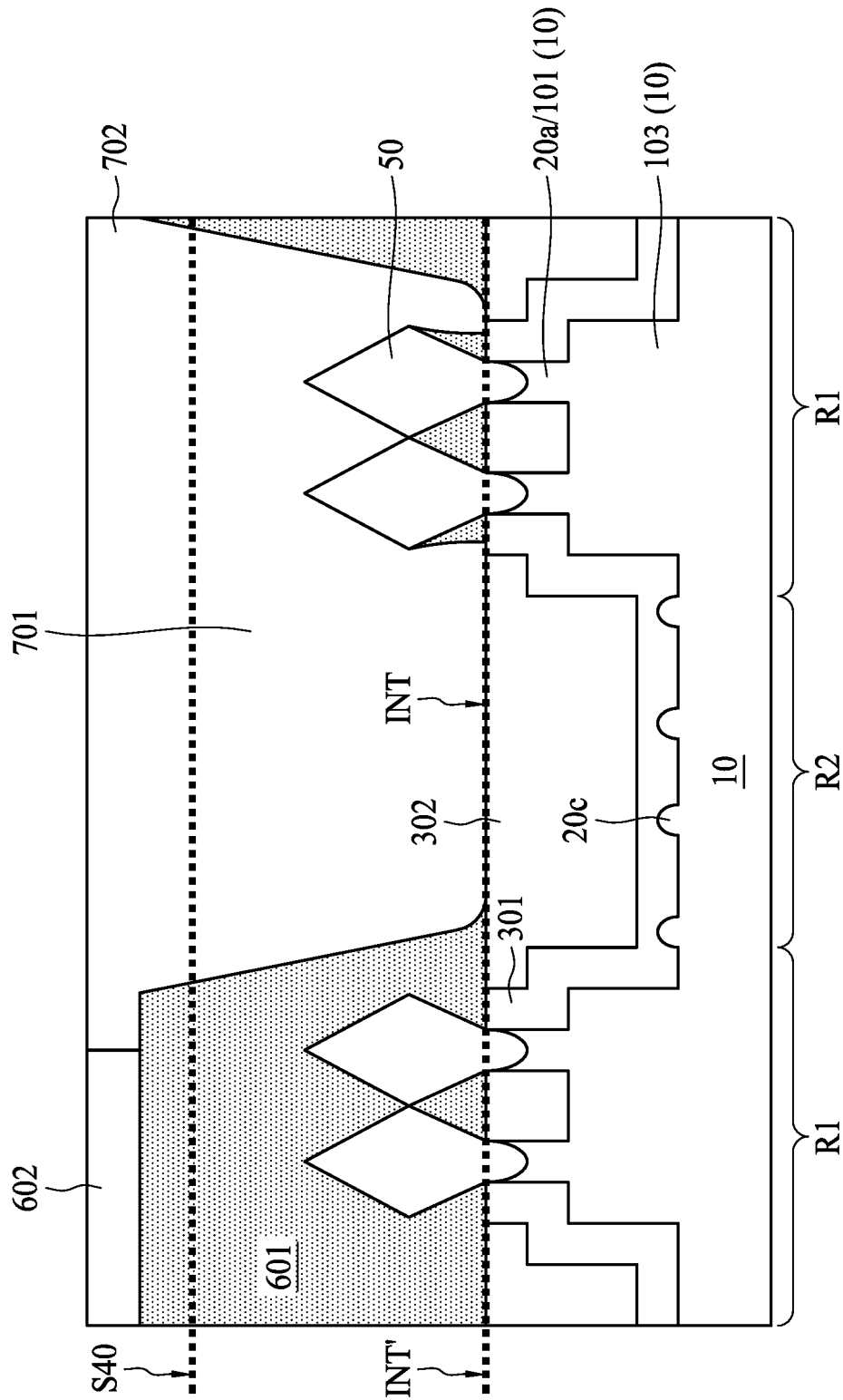

In some embodiments, operations related to those shown in FIGS. 13 to 16 and 18 are performed on the intermediate structure shown in FIG. 27, and the source/drain structures 50 are at least partially exposed through the first ILD layer 601 in the recess C601 as shown in FIG. 30. In some embodiments, a silicide layer is formed on the exposed portion of the source/drain structures 50 after formation of the recess C601. Referring to FIG. 31, operations related to those shown in FIGS. 19 to 20 and 22 are performed on the intermediate structure shown in FIG. 30. The first contact 701 is electrically connected with the source/drain structures 50. In some embodiments, the first contact 701 covers the source/drain structures 50.

Some embodiments of the present disclosure provide a method for manufacturing a semiconductor structure. The method includes: providing a substrate; forming a plurality of fin structures on the substrate; disposing a first dielectric layer over and between the plurality of fin structures; disposing a second dielectric layer over the first dielectric layer; removing a portion of the first dielectric layer and a portion of the second dielectric layer, wherein each of the plurality of fin structures is at least partially exposed through the first dielectric layer and the second dielectric layer; forming a gate structure over the plurality of fin structures; forming an interlayer dielectric (ILD) layer over the first dielectric layer and the second dielectric layer and around the gate structure; removing a portion of the ILD layer; and forming a contact in the ILD layer, wherein the contact is disposed above the second dielectric layer.

Some embodiments of the present disclosure provide a method for manufacturing a semiconductor structure. The method includes: forming a plurality of fin structures and a plurality of micro-fins between the plurality of fin structures on a substrate; forming a first dielectric layer around the plurality of fin structures and over the plurality of micro-fins; forming a second dielectric layer over the first dielectric layer and the plurality of micro-fins; forming an interlayer dielectric (ILD) layer over the first dielectric layer and the second dielectric layer; performing an etching operation on the ILD layer; and forming a contact surrounded by the ILD layer and disposed above the second dielectric layer.

Some embodiments of the present disclosure provide a semiconductor structure. The semiconductor structure includes: a substrate including a plurality of fin structures thereon; a plurality of source/drain structures, disposed on the plurality of fin structures; a plurality of gate structures, disposed over and across the plurality of fin structures; an isolation structure, disposed between the plurality of fin structures; and a plurality of contacts, disposed between the plurality of gate structures. The isolation structure includes: a first dielectric layer surrounding the plurality of fin structures; and an etch stop layer disposed over the first dielectric layer and between the plurality of fin structures. The plurality of contacts include: a first contact disposed over the isolation structure and above the first dielectric layer and the etch stop layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   providing a substrate;
   forming a plurality of fin structures on the substrate;
   disposing a first dielectric layer over and between the plurality of fin structures;
   disposing a second dielectric layer over the first dielectric layer;
   removing a portion of the first dielectric layer and a portion of the second dielectric layer, wherein each of the plurality of fin structures is at least partially exposed through the first dielectric layer and the second dielectric layer;
   forming a gate structure over the plurality of fin structures;
   forming an interlayer dielectric (ILD) layer over the first dielectric layer and the second dielectric layer and around the gate structure;
   removing a portion of the ILD layer; and
   forming a contact extending into the ILD layer, wherein the contact is disposed above the second dielectric layer.

2. The method of claim 1, wherein the second dielectric layer has an etching rate different from an etching rate of the ILD layer to an etchant.

3. The method of claim 1, wherein the second dielectric layer includes nitride, and the ILD layer includes oxide.

4. The method of claim 1, wherein the removing of the portion of the ILD layer comprises:
   forming a recess in the ILD layer and stopped at the second dielectric layer.

5. The method of claim 1, further comprising:
   disposing a third dielectric layer over the second dielectric layer; and
   removing a portion of the third dielectric layer to at least partially expose the plurality of fin structures prior to the formation of the contact.

6. The method of claim 5, wherein the contact is formed through the ILD layer and into the third dielectric layer.

7. The method of claim 5, wherein the third dielectric layer and the second dielectric layer have different etching rates to the etchant.

8. The method of claim 5, wherein the third dielectric layer and the ILD layer include same material.

9. A method for manufacturing a semiconductor structure, comprising:
   forming a plurality of fin structures and a plurality of micro-fins between the plurality of fin structures on a substrate;
   forming a first dielectric layer around the plurality of fin structures and over the plurality of micro-fins;
   forming a second dielectric layer over the first dielectric layer and the plurality of micro-fins;
   forming an interlayer dielectric (ILD) layer over the first dielectric layer and the second dielectric layer;
   performing an etching operation over the ILD layer; and
   forming a contact surrounded by the ILD layer and disposed above the second dielectric layer.

10. The method of claim 9, wherein the forming of the plurality of fin structures and the plurality of micro-fins comprises:
    forming a plurality of uncut fin structures on the substrate; and
    performing a fin cut operation on the plurality of uncut fin structures, thereby forming the plurality of fin structures and a plurality of fin residues between the plurality of fin structures.

11. The method of claim 10, wherein the forming of the plurality of fin structures and the plurality of micro-fins further comprises:
    removing a portion of the substrate between the plurality of fin structures, thereby forming the plurality of micro-fins from the plurality of fin residues and at least one crown structure at a bottom of one or more of the plurality of fin structures.

12. The method of claim 9, wherein the etching operation comprises:
    forming a recess overlapping the plurality of micro-fins from a top view perspective, wherein the recess reaches the second dielectric layer.

13. The method of claim 9, wherein the forming of the first dielectric layer includes a conformal deposition, and the first dielectric layer fills spaces between the plurality of fin structures.

14. The method of claim 9, wherein the forming of the second dielectric layer includes a conformal deposition, and a profile of the second dielectric layer is conformal to a profile of the first dielectric layer.

15. The method of claim 9, wherein the forming of the second dielectric layer includes a blanket deposition, and a top surface of the second dielectric layer is substantially planar and over the plurality of fin structures and the first dielectric layer.

16. The method of claim 9, wherein the first dielectric layer covers the plurality of micro-fins.

17. A method for manufacturing a semiconductor structure, comprising:
    forming a plurality of fin structures protruded from a substrate, and a plurality of micro-fins between the plurality of fin structures and protruded from the substrate;
    forming an oxide layer surrounding the plurality of fin structures and covering the plurality of micro-fins;
    forming a nitride layer surrounded by the oxide layer and disposed above the plurality of micro-fins;
    forming an interlayer dielectric (ILD) layer over the oxide layer and the nitride layer and surrounding the plurality of fin structures; and
    forming a contact extending through the ILD and disposed above the plurality of micro-fins, the oxide layer and the nitride layer.

18. The method of claim 17, wherein the contact is disposed above the plurality of fin structures.

19. The method of claim 17, wherein a top surface of the ILD is substantially coplanar with a top surface of the contact.

20. The method of claim 17, wherein a thickness of the nitride layer is in a range of 20 to 40 nm.

* * * * *